(12) United States Patent
Murakami et al.

(10) Patent No.: US 7,195,801 B2
(45) Date of Patent: Mar. 27, 2007

(54) MANUFACTURING PROCESS FOR STORING AND TRANSFERRING EVAPORATION MATERIAL

(75) Inventors: Masakazu Murakami, Kanagawa (JP); Hisashi Ohtani, Tochigi (JP); Shunpei Yamazaki, Tokyo (JP); Hideaki Kuwabara, Kanagawa (JP)

(73) Assignee: Semiconductor Energy laboratory Co., Ltd., Kanagawa-ken (JP)

( * ) Notice: Subject to any disclaimer, the term of this patent is extended or adjusted under 35 U.S.C. 154(b) by 536 days.

(21) Appl. No.: 10/356,722

(22) Filed: Feb. 3, 2003

(65) Prior Publication Data
US 2003/0180457 A1 Sep. 25, 2003

(30) Foreign Application Priority Data
Feb. 5, 2002 (JP) ............................. 2002-028825

(51) Int. Cl.
C23C 8/00 (2006.01)
C23C 16/00 (2006.01)

(52) U.S. Cl. ..................... 427/585; 427/69; 427/255.6; 414/800

(58) Field of Classification Search ................ 427/585, 427/68, 69, 70, 157, 248.1, 255.6, 445; 414/800, 414/804, 806; 206/524.1, 524.5; 118/726
See application file for complete search history.

(56) References Cited

U.S. PATENT DOCUMENTS 4,032,791 A * 6/1977 Chiola et al. ............ 250/483.1
4,594,528 A 6/1986 Kawakyu et al.
5,118,986 A 6/1992 Ohnuma et al.
5,427,858 A 6/1995 Nakamura et al.
5,505,985 A 4/1996 Nakamura et al.

(Continued)

FOREIGN PATENT DOCUMENTS

JP 10-168559 6/1998

(Continued)

OTHER PUBLICATIONS

Australian Search Report dated Oct. 12, 2004 for 200300236-7.

(Continued)

Primary Examiner—Timothy Meeks
Assistant Examiner—David Turocy
(74) Attorney, Agent, or Firm—Nixon Peabody LLP; Jeffrey L. Costellia

(57) ABSTRACT

A manufacturing system capable of enhancing reliability and luminance of a light emitting element is provided which uses an EL material of very high purity in evaporation. The system is also capable of using an EL material efficiently. Instead of a glass jar, a container (first container 11a) to be set in an evaporation apparatus is employed and a material maker (18) stores an EL material (12), or refines it by sublimation and stores, directly in the container. The container is then transferred to a light emitting device maker (19) for evaporation. With a manufacturing system as such, impurities are prevented from contaminating a highly pure EL material. This system also eliminates the trouble of transferring an EL material from a glass jar to a container. The container may be recovered by the material maker and the EL material remaining in the container may be collected for reuse by the manufacturing system.

93 Claims, 13 Drawing Sheets

U.S. PATENT DOCUMENTS

| | | | |
|---|---|---|---|
| 5,505,986 A * | 4/1996 | Velthaus et al. | 427/66 |
| 5,525,313 A | 6/1996 | Kawano et al. | |
| 5,635,111 A | 6/1997 | Kawano et al. | |
| 5,688,551 A | 11/1997 | Littman et al. | |
| 5,817,366 A * | 10/1998 | Arai et al. | 427/66 |
| 5,869,134 A * | 2/1999 | Reddy et al. | 427/96.8 |
| 5,885,365 A * | 3/1999 | Sugai et al. | 134/26 |
| 5,902,688 A | 5/1999 | Antoniadis et al. | |
| 5,904,961 A * | 5/1999 | Tang et al. | 427/561 |
| 5,965,904 A | 10/1999 | Ohtani et al. | |
| 5,981,048 A * | 11/1999 | Sugimoto et al. | 428/216 |
| 6,049,167 A | 4/2000 | Onitsuka et al. | |
| 6,087,772 A | 7/2000 | Ootsuki et al. | |
| 6,118,212 A | 9/2000 | Nakaya et al. | |
| 6,179,923 B1 * | 1/2001 | Yamamoto et al. | 118/719 |
| 6,259,203 B1 | 7/2001 | Kawamura et al. | |
| 6,296,894 B1 * | 10/2001 | Tanabe et al. | 427/8 |
| 6,337,102 B1 | 1/2002 | Forrest et al. | |
| 6,342,103 B1 | 1/2002 | Ramsay | |
| 6,440,877 B1 | 8/2002 | Yamazaki et al. | |
| 6,617,051 B1 * | 9/2003 | Higashi et al. | 428/690 |
| 6,646,284 B2 | 11/2003 | Yamazaki et al. | |
| 6,649,436 B2 * | 11/2003 | Ghosh et al. | 438/29 |
| 6,664,732 B2 | 12/2003 | Yamazaki et al. | |
| 6,776,847 B2 | 8/2004 | Yamazaki et al. | |
| 6,776,880 B1 | 8/2004 | Yamazaki | |
| 6,797,314 B2 * | 9/2004 | Van Slyke et al. | 427/66 |
| 6,803,246 B2 | 10/2004 | Yamazaki et al. | |
| 6,828,727 B2 | 12/2004 | Yamazaki | |
| 6,852,997 B2 | 2/2005 | Yamazaki et al. | |
| 6,897,608 B2 | 5/2005 | Yamazaki et al. | |
| 6,946,406 B2 * | 9/2005 | Yamazaki et al. | 438/781 |
| 2001/0006827 A1 | 7/2001 | Yamazaki et al. | |
| 2001/0008121 A1 * | 7/2001 | Tanabe et al. | 118/663 |
| 2001/0021415 A1 * | 9/2001 | Kido et al. | 427/255.23 |
| 2001/0055841 A1 * | 12/2001 | Yamazaki et al. | 438/151 |
| 2002/0000979 A1 | 1/2002 | Furuhashi et al. | |
| 2002/0009538 A1 | 1/2002 | Arai | |
| 2002/0139303 A1 * | 10/2002 | Yamazaki et al. | 118/719 |
| 2003/0015140 A1 * | 1/2003 | Van Slyke et al. | 118/723 VE |
| 2003/0162314 A1 | 8/2003 | Yamazaki et al. | |
| 2003/0180457 A1 | 9/2003 | Murakami et al. | |
| 2003/0219530 A1 | 11/2003 | Yamazaki et al. | |
| 2006/0003099 A1 * | 1/2006 | Jabbour | 427/248.1 |

FOREIGN PATENT DOCUMENTS

| | | |
|---|---|---|
| JP | 11-350112 A | 12/1999 |
| JP | 2000-223269 | 8/2000 |
| JP | 2000-223269 A | 8/2000 |
| JP | 2001-093844 A | 4/2001 |
| JP | 2001-093848 A | 4/2001 |

OTHER PUBLICATIONS

Written Opinion and Australian Patent Office Search Report for Application No. SG 200300236-7; dated Oct. 12, 2004.

Gu et al. "Transparent Organic Light Emitting Devices" Applied Physics Letters; May 6, 1996; pp. 2606-2608, vol. 68#19.

Gu et al. "Transparent Organic Light Emitting Devices", Applied Physics Letters; May 6, 1996; vol. 68, No. 19, pp. 2606-2608.

* cited by examiner

LIGHT EMITTING DIRECTION

LIGHT EMITTING DIRECTION

TO FILM FORMING CHAMBER

MELTING POT

SUBSTRATE HOLDER

CHAMBER

MELTING POT

FIG. 13D

| MATERIAL | INITIAL CONSUMPTION (g) | AMOUNT OF REFILL (g) | CONSUMPTION AFTER TREATING 120 SUBSTRATES(g) |
|---|---|---|---|
| CuPc | 2 | 0.5 | 16.5 |
| α-NPD | 3 | 1 | 32 |
| Alq3 | 3 | 1 | 32 |
| DMQa | 1 | 0.05 | 2.45 |
| CaF2 | 2 | 2 | 60 |
| Al(RE) | 12 | 12 | 360 |

MANUFACTURING PROCESS FOR STORING AND TRANSFERRING EVAPORATION MATERIAL

BACKGROUND OF THE INVENTION

1. Field of the Invention

The present invention relates to a manufacturing system for producing a light emitting device that has an EL element on a substrate, specifically, a manufacturing system of a layer of a highly pure organic compound. The present invention also relates to a method of operating a manufacturing apparatus as well as a light emitting device obtained by the operation method. Also related to the present invention is an organic compound recycling system.

2. Description of the Related Art

The study of light emitting devices in which light emitting elements such as EL elements are used has become active in recent years. In particular, a light emitting device using EL material comprising an organic material is attracting attention. Such a light emitting device is called an EL display comprising an organic material or a light-emitting diode comprising an organic material.

Note that EL elements have a layer containing an organic compound in which luminescence develops by adding an electric field (electroluminescence) (hereinafter referred to as EL layer), an anode, and a cathode. There is light emission when returning to a ground state from a singlet excitation state (fluorescence), and light emission when returning to a ground state from a triplet excitation state (phosphorescence) in the organic compound luminescence, and it is possible to apply both types of light emission to light emitting devices manufactured by the film forming apparatus and film formation method of the present invention.

Unlike liquid crystal display devices, light emitting devices are of a self-luminous type, so there is no problem of a view angle. More specifically, a light emitting device is more suitable as a display used outside, compared with a liquid crystal display. Thus, the use of light emitting devices in various forms has been proposed.

Further, there are two systems for light emitting devices the first being an EL layer formed between two kinds of stripe-shaped electrodes provided so as to be orthogonal to each other (passive matrix system) and the second being an EL layer formed between pixel electrodes arranged in a matrix so as to be connected to a TFT and a counter electrode (active matrix system).

EL elements have a structure in which an EL layer is sandwiched between a pair of electrodes, and the EL layer normally has a laminate structure. Examples of laminate structures may include "hole transporting layer/light emitting layer/electron transporting layer", which have extremely high light emitting efficiency.

Further, a structure in which: a hole injecting layer, a hole transporting layer, a light emitting layer, and an electron transporting layer are laminated in this order on an anode; or a hole injecting layer, a hole transporting layer, a light emitting layer, an electron transporting layer, and an electron injecting layer are laminated in this order on an anode may also be used. Fluorescent pigments and the like may also be doped into the light emitting layers. Further, all of the layers may be formed using low-molecular weight materials, or some of the layers may be formed using high-molecular weight materials.

Note that all layers formed between a cathode and an anode are referred to generically as EL layers in this specification. The aforementioned hole injecting layer, hole transporting layer, light emitting layer, electron transporting layer, and electron injecting layer are therefore all included in the category of EL layers.

Further, in this specification, the EL element is a light emitting element formed of a structure in which a layer including an EL material and an organic or inorganic material for introducing a carrier to the EL material (hereinafter referred to as an EL layer) is sandwiched between two electrodes (an anode and a cathode), and is a diode formed from an anode, a cathode, and the EL layer.

With an EL element using EL material comprising an organic material, a structure of an EL layer formed with a combination of EL material and organic material is commonly used. Although the EL material comprising organic material or organic material is generally classified into low-molecular weight (monomer based) material, and high-molecular weight (polymer based) material, the low-molecular weight material primarily forms a film with vapor disposition.

The most serious problem of practical use of these EL elements lies in that the element's life is insufficient. Degradation of an element is exhibited in such a manner that a non-light emitting region (dark spot) spreads along with light-emission for a long period of time, which is caused by the degradation of an EL layer.

EL material forming an EL layer is easily degraded by impurities such as oxygen and water. Furthermore, it is possible that inclusion of other impurities in EL materials may cause an EL layer to be degraded.

Major examples of a process that allows oxygen, water and other impurities to contaminate an EL material to be subjected to evaporation include a process of setting an EL material in an evaporation apparatus before evaporation and an evaporation process.

Usually, a container keeping an EL material is put in a brown glass jar and the jar is lidded with a plastic lid (cap). The airtightness of the container keeping an EL material may be insufficient.

In prior art, when a film is formed by evaporation, a given amount of evaporation material is taken out of its container (glass jar) and is moved into a container (typically, a melting pot or an evaporation boat) set opposed to an object on which the film is to be formed in the evaporation apparatus. The evaporation material could be contaminated by impurities during moving the evaporation material. To elaborate, oxygen, water, and other impurities that can cause degradation of an EL element could mix with the evaporation material.

One way to move an evaporation material from a glass jar to a container is by hand in a pretreatment chamber equipped with an evaporation apparatus having a glove box or the like. However, a pretreatment chamber equipped with a glove box does not allow vacuum and the work has to be done in atmospheric pressure. A nitrogen atmosphere can be employed but even then the amount of moisture and oxygen in the pretreatment chamber is not small enough. The use of a robot is possible but impractical since it is not easy to create a robot that can transfer evaporation material in a powder form between containers. This makes it difficult to build an integrated closed system in which steps from forming an EL layer on a lower electrode and till forming an upper electrode are automated to avoid impurity contamination.

Although a light emitting device maker could refine an evaporation material bought from a material maker to further enhance the purity of the evaporation material, refining is laborious and still presents a chance for impurity contamination when an evaporation material is set in an evaporation apparatus.

In addition, an EL material is very expensive and it costs more per gram than gold does per gram. It is therefore desired to use an EL material as efficiently as possible.

SUMMARY OF THE INVENTION

The present invention has been made in view of the above, and an object of the present invention is therefore to provide a system in which high purity of an EL material is maintained and steps from forming an EL layer on a lower electrode and till forming an upper electrode are automated to improve throughput as well as an integrated closed system capable of avoiding impurity contamination.

Another object of the present invention is to use an EL material efficiently.

Another object of the present invention is to enhance the reliability and luminance of a light emitting element by using a highly pure EL material.

The present invention avoids impurity contamination of a highly pure EL material through a manufacturing system in which an EL material is directly stored in a container to be set in an evaporation apparatus instead of a conventional container for keeping an EL material, typically a brown glass jar etc., and then the container is transferred to the evaporation apparatus for evaporation. To store an EL material directly in the container, the EL material may be refined by sublimation right in the container to be set in the evaporation apparatus instead of adding the obtained EL material in several portions. The present invention makes it possible to deal with further increase in purity of EL materials in future.

It is desirable for a light emitting device maker using an evaporation apparatus to have a material maker that manufactures or sells an EL material do the storing work to put an EL material directly in a container that is to be set in the evaporation apparatus. The present invention provides a manufacturing system in which a light emitting device maker and a material maker are associated with each other in order to obtain an EL material of very high purity and the EL material is used to produce a highly reliable light emitting device. The system of the present invention does not need glass jars, which usually end up as industrial waste, and therefore is environmentally friendly. In addition, since a material maker stores, or refines and stores, an EL material directly in a container, a light emitting device maker does not have to buy an EL material in excess and can use a relatively expensive EL material efficiently. In short, unlike prior art, the present invention can avoid excess or shortage of an EL material in a glass jar.

The system of the present invention eliminates the need to move an EL material from a glass jar to a container. Accordingly, spilling the EL material by accident during the transfer is also avoided. Since a light emitting device maker is relieved of the work of transferring an EL material between containers, the maker only has to set in an evaporation apparatus a container in which an EL material is stored, or refined and stored, by a material maker in advance. As a result, the throughput is improved.

The present invention can provide a manufacturing system in which the process is automated to improve the throughput as well as an integrated closed system capable of avoiding impurity contamination.

No matter how pure EL material a material maker provides, there is always a possibility of impurity contamination as long as a light emitting device maker moves the EL material between containers as in prior art. Accordingly, the purity of an EL material cannot be maintained to put an upper limitation to the purity. The present invention makes a light emitting device maker and a material maker work together toward reduction in impurity contamination, and therefore can maintain the initial extremely high purity of an EL material provided by the material maker until after the material is subjected to evaporation in the light emitting device maker.

According to a structure of the present invention disclosed in this specification, there is provided a manufacturing system including:

a first stage of storing, or refining and storing, an evaporation material in a first container at a material maker and sealing the first container that stores the evaporation material in a second container;

a second stage of transferring the second container to a light emitting device maker;

a third stage of introducing the second container into a manufacturing apparatus at the light emitting device maker and taking the first container out of the second container to place the first container; and a fourth stage of heating the first container in the manufacturing apparatus for evaporation.

Needless to say, the container does not have to be prepared and manufactured by a material maker but can be ordered from an outside supplier. Desirably, the container to be set in the evaporation apparatus is manufactured by an apparatus maker that has provided the light emitting device maker with the evaporation apparatus. The present invention provides a manufacturing system in which an apparatus maker, a light emitting device maker, and a material maker are associated with each other in order to obtain an EL material of very high purity and the EL material is used to produce a highly reliable light emitting device.

According to another structure of the present invention disclosed in this specification, there is provided a manufacturing system including:

a first stage of transferring a first container and a second container from an apparatus maker to a material maker;

a second stage of storing, or refining and storing, an evaporation material in the first container at the material maker and sealing the first container that stores the evaporation material in the second container;

a third stage of transferring the second container to a light emitting device maker;

a fourth stage of introducing the second container into a manufacturing apparatus at the light emitting device maker and taking the first container out of the second container to place the first container; and a fifth stage of heating the first container in the manufacturing apparatus for evaporation.

Further, the container to be set in the evaporation apparatus may be manufactured and prepared by the light emitting device maker.

According to another structure of the present invention disclosed in this specification, there is provided a manufacturing system comprising:

a first stage of transferring a second container and a first container from a light emitting device maker to a material maker;

a second stage of storing, or refining and storing, an evaporation material in the first container at the material maker and sealing the first container that stores the evaporation material in the second container;

a third stage of transferring the second container to the light emitting device maker;

a fourth stage of introducing the second container into a manufacturing apparatus at the light emitting device maker and taking the first container out of the second container to place the first container; and a fifth stage of heating the first container in the manufacturing apparatus for evaporation.

Further, when an EL layer is formed by evaporation, the whole EL materials stored in the container are not evaporated, and after evaporation, an unevaporated EL material is adhered to the container. In the above manufacturing system, this container may be recovered by the material maker and the EL material remaining in the container is taken out for recycling. Moreover, in the above manufacturing system, after taken out, the EL material remaining in the container may be refined to increase the purity for recycling.

According to another structure of the present invention disclosed in this specification, there is provided a manufacturing system including:

a first stage of transferring a first container and a second container from a light emitting device maker to a material maker;

a second stage of storing, or refining and storing, an evaporation material in the first container at the material maker and sealing the first container that stores the evaporation material in the second container;

a third stage of transferring the second container to the light emitting device maker;

a fourth stage of introducing the second container into a manufacturing apparatus at the light emitting device maker and taking the first container out of the second container to place the first container;

a fifth stage of heating the first container in the manufacturing apparatus for evaporation; and a sixth stage of taking the first container out of the manufacturing apparatus and sealing the first container in the second container to transfer the container from the light emitting device maker to the material maker.

Further, the above structure is characterized in that the material maker recovers the evaporation material adhered to the inner walls of the first container after evaporation for recycling. If the evaporation material is to be recovered, it is desirable for later refinement of an EL material to recover the evaporation material while it is sealed in the second container so that impurity contamination is avoided.

The above structures are characterized in that the first container is stored in the second container in an inert gas atmosphere or in vacuum and, after an evaporation material is stored, or refined and stored, the container is placed in the manufacturing apparatus without exposing the container to the air. In this way, water and oxygen in the air are prevented from adhering to outer walls and the like of the first container due to exposure to the air. In the present invention, contamination of a container to be set in an evaporation apparatus should be avoided as much as possible since an EL material is stored, or refined and stored, directly in the container for transportation. If the container is set in the evaporation apparatus with water and oxygen adhered to the outer walls and the like of the container, the impurities could contaminate the EL material during evaporation.

The above structures are characterized in that the manufacturing apparatus has plural process chambers equipped with vacuum exhaust means, a process chamber where the first container is taken out of the second container, and a vacuum evaporation apparatus. The manufacturing apparatus may be multi-chamber type or in-line type. Specifically, the second container in which the first container is sealed is introduced into a first chamber (process chamber) filled with inert gas, the first chamber is vacuum-exhausted to remove impurities from the inside thereof, inert gas is introduced to the chamber to return it to the atmospheric pressure, and the first container is taken out of the second container. Then the first chamber is vacuum-exhausted, the first container is transferred to a second chamber (a vacuum evaporation apparatus that is vacuum-exhausted in advance) connected to the first chamber, and the first container is set in a desired position. Needless to say, these operations may all be performed by robots for automation. The first container may be taken out of the second container in vacuum.

In the above structures, the first container is not particularly limited but is preferably a melting pot that allows more efficient use of an EL material. An evaporation boat may be used instead of a melting pot. The first container may be a melting pot that can be sealed with a lid attached thereto.

Further, in the above structures, the second container is not particularly limited as long as the container is a light-shielding container, but is preferably a container that can withstand depressurization or pressurization.

Further, in the above structures, the material maker preferably cleans the first container or the second container before storing the EL material.

Further, in the above manufacturing system, not only the EL material is recycled, but also the material maker may clean the container for recycling. Accordingly, the number of the required containers can be saved and the EL materials can also be saved.

According to another structure of the present invention disclosed in this specification, there is provided a manufacturing system including:

a first stage of transferring a container from a light emitting device maker to a material maker;

a second stage of storing, or refining and storing, an evaporation material in the container at the material maker;

a third stage of transferring the container to the light emitting device maker;

a fourth stage of introducing the container into a manufacturing apparatus at the light emitting device maker;

a fifth stage of heating the container in the manufacturing apparatus for evaporation; and a sixth stage of taking the container out of the manufacturing apparatus to transfer the container from the light emitting device maker to the material maker and storing again the evaporation material in the container.

In the above structures, the container may be replaced by a first container and the first container may be sealed in a second container during transportation. If the first container is to be recycled, it is desirable for later storing of an EL material to recover the first container while it is sealed in the second container so that impurity contamination is avoided. If an EL material is to be recycled, it is desirable for later refinement of the EL material to recover the EL material while it is sealed in the second container so that impurity contamination is avoided.

Further, the above structure is characterized in that the container is a melting pot or the container is a melting pot that can be sealed with a lid attached thereto.

Further, the above structure is characterized in that the material maker recovers the evaporation material adhered to the inner walls of the container at the sixth stage for recycling. Further, the above structure is characterized in that the material maker cleans the container. Further, the above structure is characterized in that the manufacturing apparatus is a vacuum evaporation apparatus.

Further, the above structures are characterized in that the manufacturing apparatus is a multi-chamber type manufacturing apparatus having at least one vacuum evaporation apparatus.

Further, the present invention also provides a manufacturing method in which an evaporation material is refined by sublimation directly in the container (melting pot etc.) that is set in an evaporation apparatus for evaporation. According to another structure of the present invention, there is provided a manufacturing method including:

a first step of refining an evaporation material in a container;

a second step of placing in an evaporation apparatus a second container so as to face an evaporation object; and a third step of heating the container placed in the evaporation apparatus for evaporation.

In this specification, a melting pot means a cylindrical container with a relatively large opening which is formed of sintered BN, a sintered composition of BN and AlN, quartz graphite, other materials and which can withstand high temperature, high pressure, and reduced pressure. An example of the exterior of the melting pot is shown in FIG. 12A. In an evaporation apparatus, an evaporation source comprises a melting pot, a heater, a heat insulating layer, an outer cylinder, a cooling pipe, and a shutter device. The heater is arranged outside the melting pot and a material for distributing heat evenly is sandwiched between the pot and the heater. The heat insulating layer is provided outside the heater. The outer cylinder houses the pot, the heat-equalizing material, the heater, and the heat insulating layer. The cooling pipe is wound around the outer cylinder. The shutter device opens and closes the opening of the outer cylinder including the opening of the melting pot.

FIG. 12B shows a simplified version of a typical example in which evaporation sources are set in a vacuum evaporation apparatus. The vacuum evaporation apparatus is composed of a vacuum chamber, a substrate holder, plural evaporation sources, and others. The vacuum chamber can be kept at predetermined reduced pressure by vacuum exhaust means (not shown in the drawing). The substrate holder is fixed to the ceiling of the chamber. The evaporation sources are placed below the substrate holder facing the holder. The substrate holder has a holding unit (not shown in the drawing) for holding a substrate. A rotary axis for rotating a substrate stands upright at the center of the top face of the substrate holder. In the example shown in FIG. 12B, three melting pots are set on a base plate. However, the number of melting pots is not particularly limited and may be one, two, or four or more.

According to another structure of the present invention, there is provided a method of operating a manufacturing apparatus, including:

sealing a first container in a second container, the first container storing an organic material;

introducing the second container into a manufacturing apparatus that has vacuum exhaust means;

taking the first container out of the second container to place the first container; and heating the first container for evaporation.

Further, the above structure is characterized in that the first container has on its inner walls an organic material refined by sublimation. Further, the above structure is characterized in that the organic material is an evaporation material.

A light emitting device characterized by using the method of operating a manufacturing apparatus of the above structures uses a highly pure material and therefore has high reliability and luminance.

In the present invention, either resistance heating or evaporation method using an electron gun (the method is called EB evaporation) can be employed for evaporation. Evaporation materials in the present invention are not limited to ones containing organic compounds but may be inorganic materials (including alloy materials) forming a cathode and an anode. The present invention is effective especially when a cathode or an anode is formed from a metal material that could be decomposed upon contact with (oxygen, moisture, and the like in) the air.

Although evaporative powder organic materials are mainly used by way of example in the present invention, liquid high-molecular weight materials can also be employed. In other words, the present invention is also applicable when a film is formed by spin coating, casting, LB, the ink jet method, or the like. When a high-molecular weight material is used, a liquid high-molecular weight material of high purity is provided by a material maker, the material is stored in a first container into which the solution is successively injected using a puncture needle and a piston (syringe) through depressurization by pulling the piston, and then the first container is stored and sealed in a second container.

BRIEF DESCRIPTION OF THE DRAWINGS

In the accompanying drawings:
FIGS. 13A to 13D are diagrams of when a container is refilled for evaporation.

DETAILED DESCRIPTION OF THE PREFERRED EMBODIMENTS

Embodiment Modes of the Present Invention Will be Described Below.

[Embodiment Mode 1]

Figure 1:
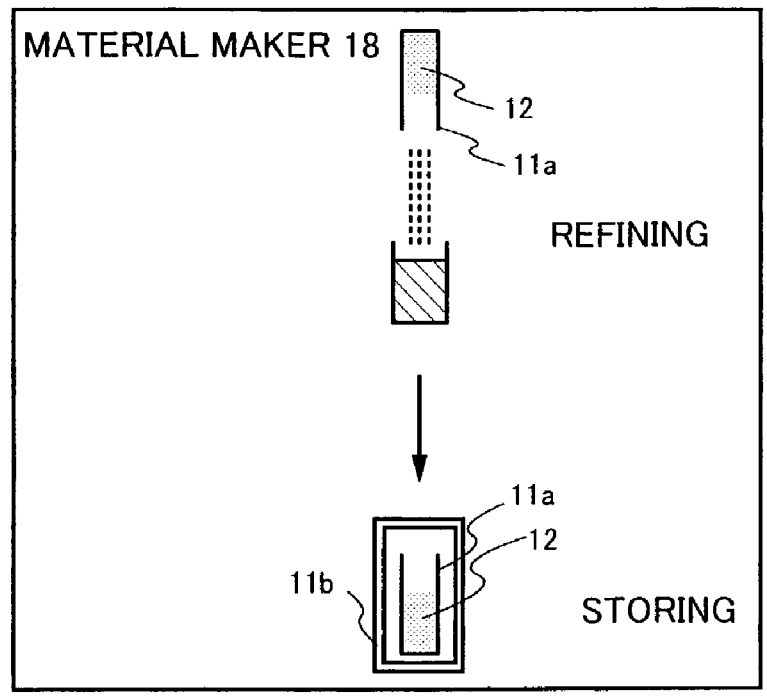
FIG. 1 is a diagram showing Embodiment Mode 1.
Figure 1:
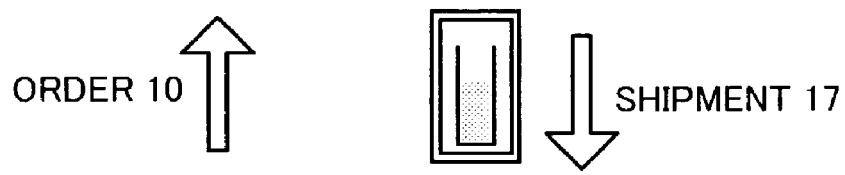
Figure 1:
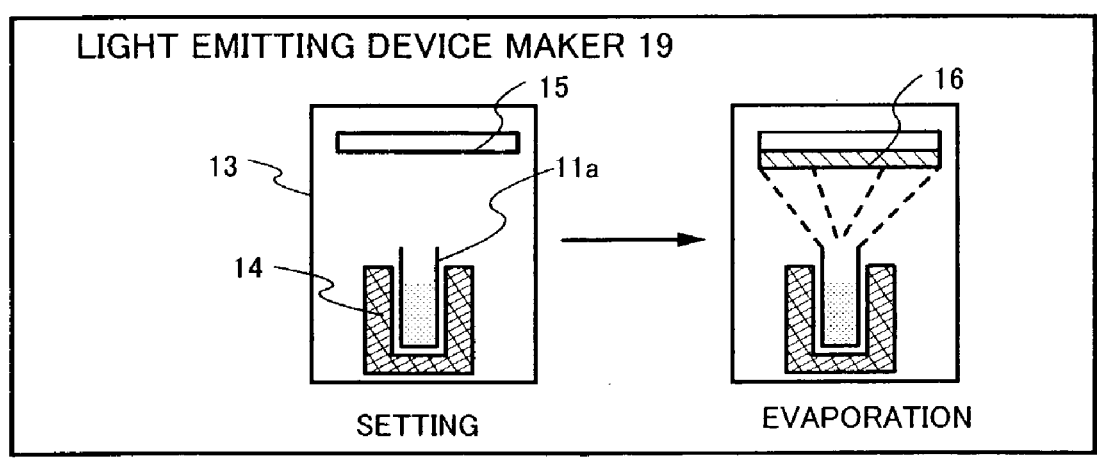

FIG. 1 is an explanatory diagram of a manufacturing system of the present invention.

In FIG. 1, reference symbol 11a denotes a first container (melting pot) and 11b denotes a second container for isolating the first container from the air to prevent contamination. Denoted by 12 is an EL material refined to have high purity. Numeral 13 denotes a chamber that can be exhausted of air, numeral 14 denotes heating means, numeral 15 denotes an evaporation object, and numeral 16 denotes an evaporation film. Numeral 18 is a material maker, which is a manufacturer of an organic compound material that is an evaporation material and produces and refines the material (typically a raw material dealer). Numeral 19 is a light emitting device maker having an evaporation apparatus, a manufacturer of a light emitting device (typically a factory).

The flow of the manufacturing system of the present invention will be described below.

First, the light emitting device maker 19 places an order 10 to the material maker 18. Receiving the order 10, the material maker 18 prepares a first container 11a and a second container 11b. The material maker stores, or refines and stores, the EL material 12 of ultra high purity in the first container 11a in a clean room while taking a great care to prevent impurities (such as oxygen and moisture) from mixing in. Thereafter, the material maker 18 preferably seals the first container 11a in the second container 11b in a clean room so as not to allow unwanted impurities to adhere to the interior or exterior of the first container. When sealing the first container, the second container 11b is preferably exhausted of air, or filled with inert gas. It is preferable to clean the first container 11a and the second container 11b before storing, or refining and storing, the EL material 12 of ultra high purity.

In the present invention, the first container 11a is to be directly set in a chamber during later evaporation. The second container 11b may be a wrapping film that serves as a barrier capable of blocking oxygen and moisture. Preferably, the second container 11b is a solid, light-shielding, cylindrical or box-like, container so that the container can be taken out automatically.

The second container 11b in which the first container 11a is sealed is next transferred from the material maker 18 to the light emitting device maker 19 (shipment 17).

The second container 11b in which the first container 11a is sealed is next introduced into a process chamber 13 that can be vacuum-exhausted. Note that, the process chamber 13 is an evaporation chamber in the inside of which the heating means 14 and the substrate holder (not shown) are set. Thereafter, the process chamber 13 is vacuum-exhausted to clean the interior and remove as much oxygen and moisture as possible. Then, the first container 11a is taken out of the second container 11b and, while maintaining vacuum, the evaporation source can be prepared by setting the first container 11a in the heating means 14. Note that, the evaporation object (here, a substrate) 15 is placed so as to face the first container 11a.

Next, the heating means 14 heats the evaporation material through resistant heating or the like to form an evaporation film 16 on the surface of the evaporation object 15 facing the evaporation source. The thus obtained evaporation film 16 does not contain impurities. A light emitting element formed from this evaporation film 16 can have high reliability and high luminance.

As described, the first container 11a is introduced into the evaporation chamber 13 without being exposed to the air even once and the evaporation material 12 is evaporated maintaining its purity of when it is stored at the material maker. In addition, since the material maker stores the EL material 12 directly in the first container 11a, the light emitting device maker does not have to buy the EL material in excess and can use the relatively expensive EL material efficiently.

Figure 13A:
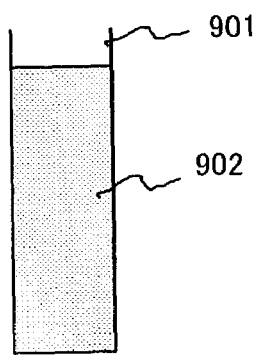
Figure 13B:
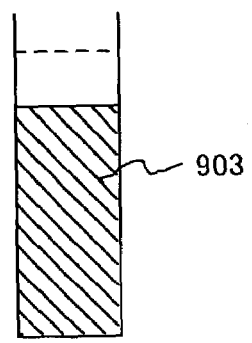
Figure 13C:
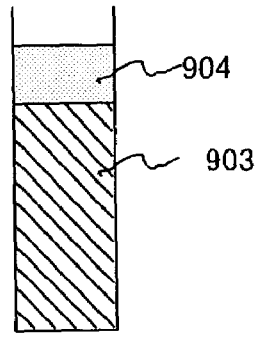

Since a material is used inefficiently in evaporation, economical use of a material is obtained by, for example, a method shown in FIGS. 13A to 13D. During maintenance of the device, a new EL material 902 is put in a melting pot 901 (FIG. 13A). After evaporation is conducted once, residue 903 is remained unevaporated as shown in FIG. 13B. Before the next evaporation, the pot is newly refilled with an EL material 904. FIGS. 13B and 13C are repeated each time evaporation is conducted until the next maintenance. In this way an evaporation material can be used more efficiently. However, this method has a drawback that the residue can cause contamination. In addition, the pot is refilled by hand and the purity of the evaporation material could be lowered due to mixing in of oxygen and moisture during refilling. An example of the amount of a refill in this method is shown in FIG. 13D. A melting pot that has undergone evaporation several times is discarded upon maintenance. In order to avoid impurity contamination, a melting pot may be filled with only new EL material and discarded after each time evaporation is conducted, though this leads to rise in manufacturing cost.

The above manufacturing system eliminates the need for a glass jar which is used in prior art to store an evaporation material as well as the work of transferring an EL material from a glass jar to a melting pot. As a result, impurity contamination is prevented and the throughput is improved.

The present invention can provide a manufacturing system in which the process is thoroughly automated to improve the throughput, as well as an integrated closed system capable of avoiding impurity contamination of the evaporation material 12 refined by the material maker 18.

[Embodiment Mode 2]

The purity of a highly pure EL material is maintained by a coalition between two makers in the example shown in Embodiment Mode 1. This embodiment mode shows an example in which three makers are associated with each other to maintain the purity of a highly pure EL material.

Figure 2:
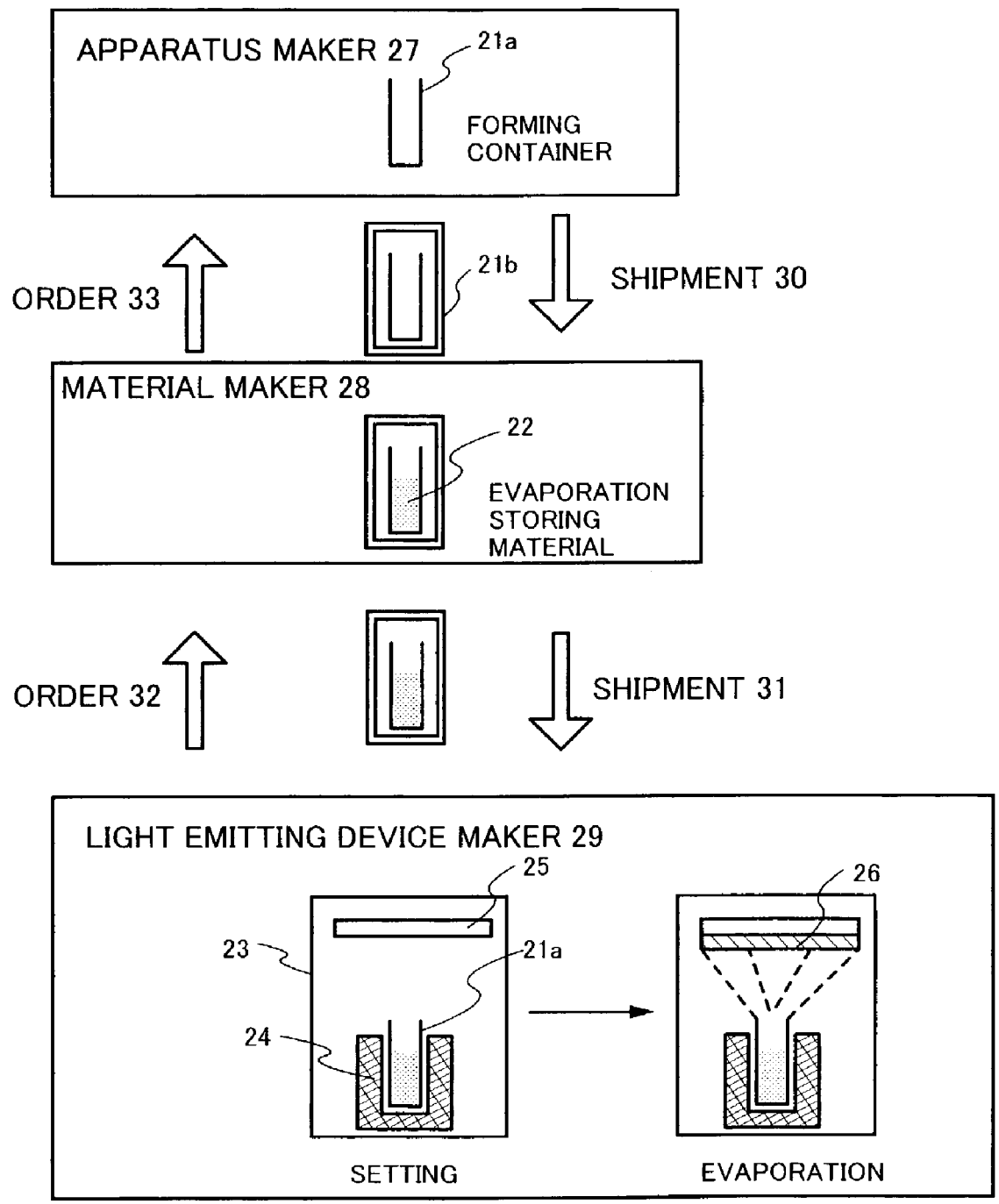
FIG. 2 is a diagram showing Embodiment Mode 2.

FIG. 2 is an explanatory diagram of a manufacturing system of the present invention.

In FIG. 2, numeral 21a denotes a first container (melting pot) and numeral 21b denotes a second container for isolating the first container from the air to prevent contamination. Denoted by 22 is a powder EL material refined to have high purity. Numeral 23 denotes a chamber that can be exhausted of air, numeral 24 denotes heating means, numeral 25 denotes an evaporation object, and numeral 26 denotes an evaporation film. Further, numeral 27 is an apparatus maker, which is a manufacturer of an evaporation apparatus. Further, numeral 28 is a material maker, which is a manufacturer of an organic compound material that is an evaporation material and produces and refines the material (typically a raw material dealer). Numeral 29 is a light emitting device maker having an evaporation apparatus, a manufacturer of a light emitting device (typically a factory).

The flow of the manufacturing system of the present invention will be described below.

First, the light emitting device maker 29 places an order 32 to the material maker 28. Receiving the order 32, the material maker 28 places an order 33 to the apparatus maker 27. The apparatus maker 27 is a supplier who has manufactured an evaporation apparatus in which the first container 21a can be set in an evaporation source and who has sold the evaporation apparatus to the light emitting device maker 29. Receiving the order 33, the apparatus maker 27 manufactures the first container 21a and the second container 21b. The first container 21a and the second container 21b are manufactured by the same apparatus maker 27 in the example shown here, but they may be manufactured by separate apparatus makers. It is preferable to clean the first container 21a and the second container 21b upon completion of the manufacture thereof.

The first container 21a is to be directly set in a chamber during later evaporation. The second container 21b may be a wrapping film that serves as a barrier capable of blocking oxygen and moisture. Preferably, the second container 21b is a solid, light-shielding, cylindrical or box-like, container so that the container can be taken out automatically. Thereafter, the apparatus maker 27 preferably seals the first container 21a in the second container 21b in a clean room so as not to allow unwanted impurities to adhere to the interior or exterior of the first container.

The second container 21b in which the first container 21a is sealed is transferred from the apparatus maker 27 to the material maker 28 (shipment 30).

The material maker stores, or refines and stores, the EL material 22 of ultra high purity in the first container 21a in a clean room while taking a great care to prevent impurities (such as oxygen and moisture) from mixing in. Thereafter, the material maker 28 preferably seals the first container 21a in the second container 21b in a clean room so as not to allow unwanted impurities to adhere to the interior or exterior of the first container. When sealing the first container, the second container 21b is preferably exhausted of air, or filled with inert gas. It is preferable to clean the first container 21a and the second container 21b before storing, or refining and storing, the EL material 22 of ultra high purity.

The second container 21b in which the first container 21a is sealed is transferred from the material maker 28 to the light emitting device maker 29 (shipment 31).

The second container 21b in which the first container 21a is sealed is introduced into a process chamber that can be vacuum-exhausted. The chamber is vacuum-exhausted to clean the interior and remove as much oxygen and moisture as possible. Then highly pure inert gas (nitrogen or the like) is introduced and the chamber is set to the atmospheric pressure. The first container 21a is taken out of the second container 21b. Then the chamber is again exhausted of air and, maintaining vacuum, the first container 21a is brought to an evaporation chamber 23 that is connected to the process chamber and is set in the heating means 24. The evaporation source is thus prepared. The evaporation object (here, a substrate) 25 is placed facing the first container 21a.

Next, the heating means 24 heats the evaporation material through resistant heating or the like to form an evaporation film 26 on the surface of the evaporation object 25 facing the evaporation source. The thus obtained evaporation film 26 does not contain impurities. A light emitting element formed from this evaporation film 26 can have high reliability and high luminance.

As described, the first container 21a is introduced into the evaporation chamber 23 without being exposed to the air even once and the evaporation material 22 can be evaporated maintaining its purity when it is stored at the material maker. In addition, since the material maker stores the EL material 22 directly in the first container 21a, the light emitting device maker does not have to buy the EL material in excess and can use the relatively expensive EL material efficiently.

The above manufacturing system eliminates the need for a glass jar which is used in prior art to store an evaporation material as well as the work of transferring an EL material from a glass jar to a melting pot. As a result, impurity contamination is prevented and the throughput is improved.

The present invention can provide a manufacturing system in which the process is thoroughly automated to improve the throughput, as well as an integrated closed system capable of avoiding impurity contamination of the evaporation material 22 refined by the material maker 28.

In the example shown here, the light emitting device maker 29 places the order 32 to the material maker 28. Instead, the light emitting device maker 29 may place an order to the apparatus maker 27.

[Embodiment Mode 3]

In an example shown here, a light emitting device maker prepares containers unlike in Embodiment Mode 1.

Figure 3:
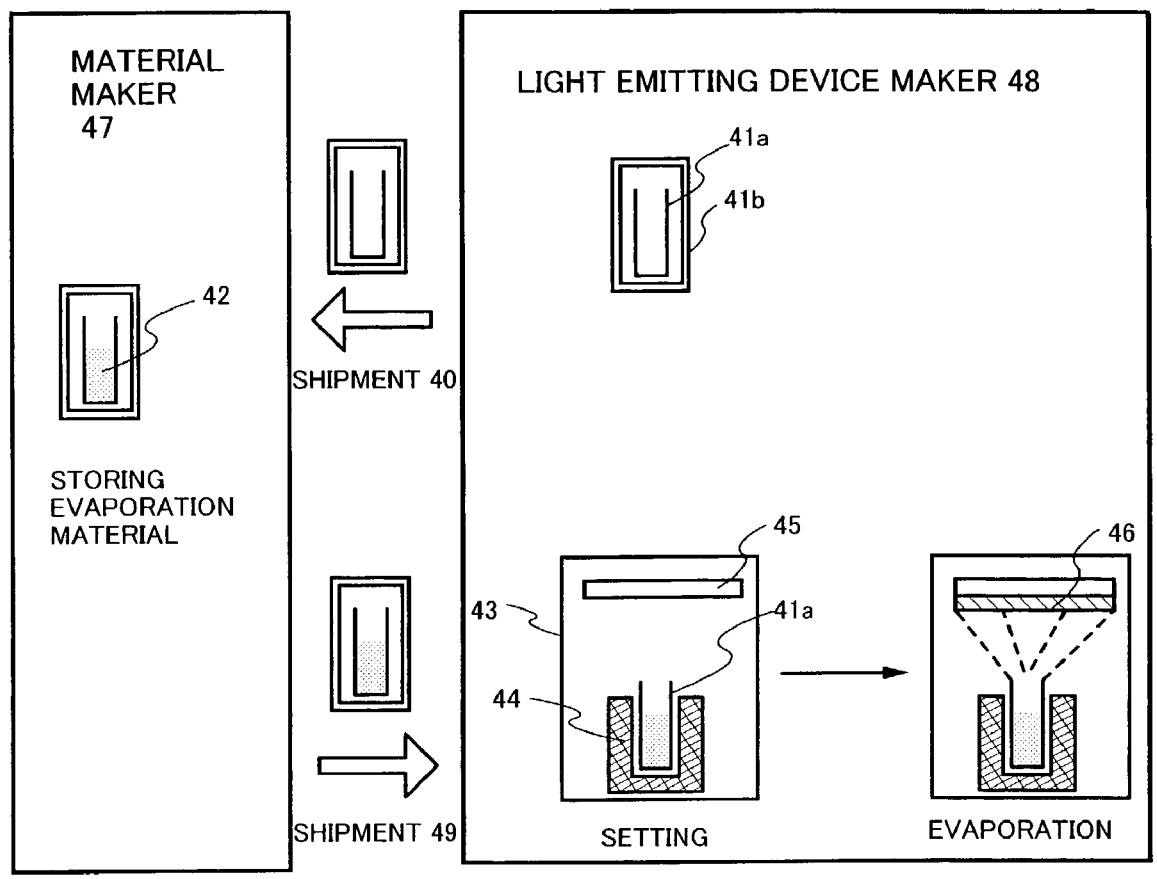
FIG. 3 is a diagram showing Embodiment Mode 3.

FIG. 3 is an explanatory diagram of a manufacturing system of the present invention.

In FIG. 3, reference symbol 41a denotes a first container (melting pot) and 41b denotes a second container for isolating the first container from the air to prevent contamination. Denoted by 42 is a power EL material refined to have high purity. 43 denotes a chamber that can be exhausted of air, 44, heating means, 45, an evaporation object, and 46, an evaporation film. Further, 47 is a material maker, which is a manufacturer of an organic compound material that is an evaporation material and produces and refines the material (typically a raw material dealer). 48 is a light emitting device maker having an evaporation apparatus, a manufacturer of a light emitting device (typically a factory).

First, the light emitting device maker 48 prepares or manufactures the first container 41a and the second container 41b. It is preferable to clean the first container 41a and the second container 41b upon completion of the manufacture thereof.

The first container 41a and the second container 41b are transferred from the light emitting device maker 48 to the material maker 47 (shipment 40). During the shipment 40, the first container 41a is preferably sealed in the second container 41b so as not to allow unwanted impurities to adhere to the interior or exterior of the first container. The shipment 40 doubles as placement of an order. Receiving the shipment, the material maker 47 takes the first container 41a out of the second container 41b in accordance with the number of the first container received and stores, or refines and stores, the EL material 42 of ultra high purity in the first container 41a in a clean room while taking a great care to prevent impurities (such as oxygen and moisture) from mixing in. Thereafter, the material maker 47 preferably seals the first container 41a in the second container 41b in a clean room so as not to allow unwanted impurities to adhere to the interior or exterior of the first container. When sealing the first container, the second container 41b is preferably exhausted of air, or filled with inert gas. It is preferable to clean the first container 41a and the second container 41b before storing, or refining and storing, the EL material 42 of ultra high purity.

Next, the second container 41b in which the first container 41a is sealed is transferred from the material maker 47 to the light emitting device maker 48 (shipment 49).

Subsequently, the second container 41b in which the first container 41a is sealed is introduced into a process chamber that can be vacuum-exhausted. The chamber is vacuum-exhausted to clean the interior and remove as much oxygen and moisture as possible. Then highly pure inert gas (nitrogen or the like) is introduced and the chamber is set to the atmospheric pressure. The first container 41a is taken out of the second container 41b. Then the chamber is again exhausted of air and, while maintaining vacuum, the first container 41a is brought to an evaporation chamber 43 that is connected to the process chamber. The first container is set in the heating means 44. The evaporation source is thus prepared. The evaporation object (here, a substrate) 45 is placed facing the first container 41a.

Next, the heating means 44 heats the evaporation material through resistant heating or the like to form an evaporation film 46 on the surface of the evaporation object 45 facing the evaporation source. The thus obtained evaporation film 46 does not contain impurities. A light emitting element formed from this evaporation film 46 can have high reliability and high luminance.

As described, the first container 41a is introduced into the evaporation chamber 43 without being exposed to the air even once and the evaporation material 42 is evaporated maintaining its purity of when it is stored at the material maker. In addition, since the material maker stores the EL material 42 directly in the first container 41a, the light emitting device maker does not have to buy the EL material in excess and can use the relatively expensive EL material efficiently.

[Embodiment Mode 4]

An example shown here is partially different from Embodiment Mode 2. Components common to Embodiment Mode 2 and Embodiment Mode 4 are denoted by the same symbols.

Figure 4:
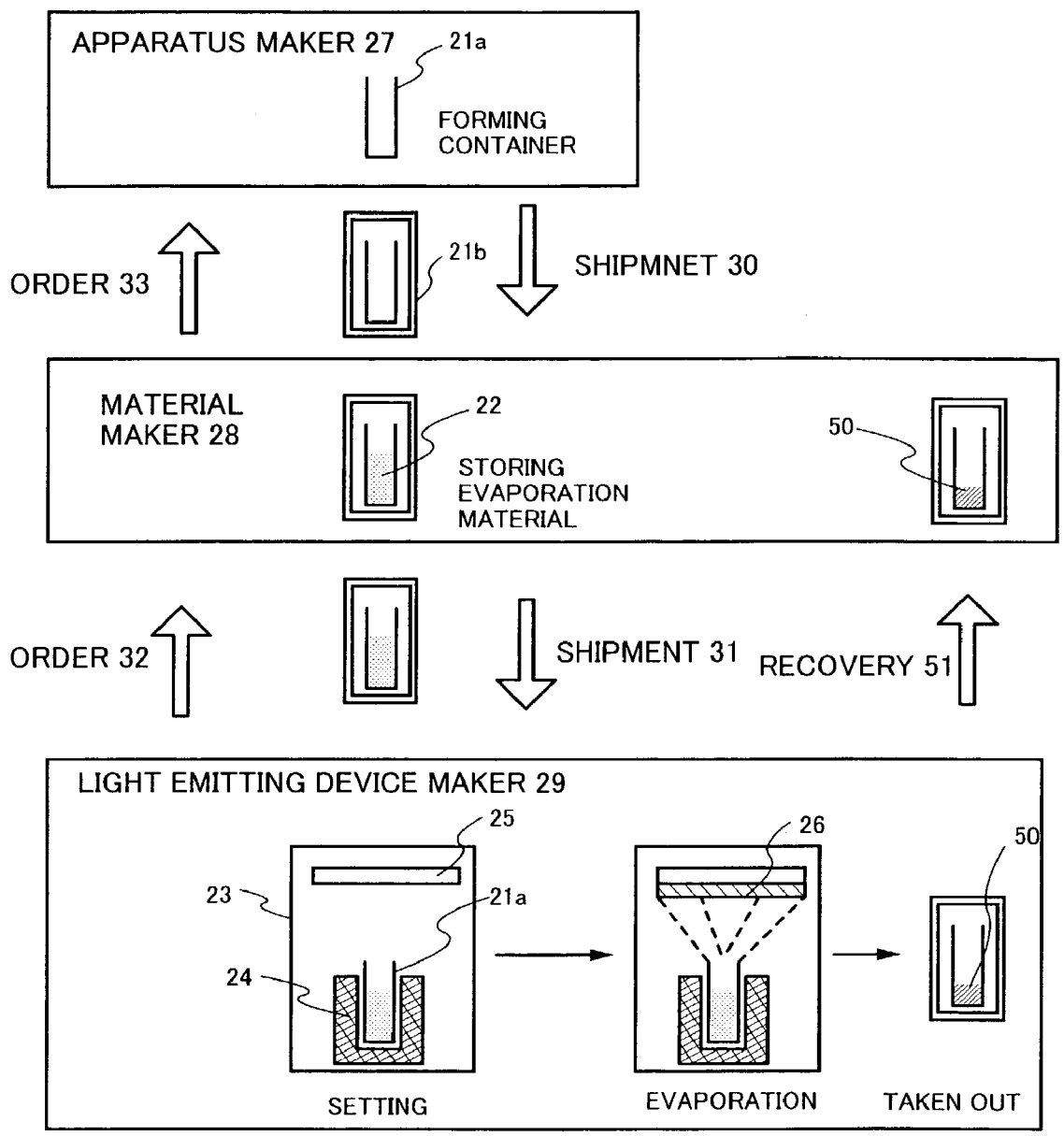
FIG. 4 is a diagram showing Embodiment Mode 4.

FIG. 4 is an explanatory diagram of a manufacturing system of the present invention.

In FIG. 4, reference symbol 50 denotes an EL material remained unevaporated. This embodiment mode introduces a system in which an EL material left in the first container 21a is recovered by the material maker 28 (recovery 51) for reuse without contaminating the EL material.

The flow of the manufacturing system in this embodiment mode is identical with the one in Embodiment Mode 2 until obtainment of the evaporation film 26. Therefore the explanation thereof is omitted here.

After the evaporation film 26 is obtained, the EL material 50 remained unevaporated solidifies at the bottom of the first container 21a. In general, the degree of evaporation greatly depends on the distance from the interface of the EL material 22 to the evaporation object, the width of the opening of the melting pot, and the temperature distribution of the melting pot. Since the distance from the EL material remaining at the bottom of the first container 21a to the evaporation object is further than that before evaporation, repeating evaporation until the EL material remaining in the first container is completely evaporated is not preferable. The margin is another reason for avoiding repeating evaporation till the remaining EL material is evaporated completely. Only one third or one fourth, or less, of an EL material that is originally put in the melting pot can be used in evaporation, which means that the material is used very inefficiently and the remaining EL material goes to waste.

This embodiment mode solves this problem by having the material maker 28 recover (recover 51) the first container 21a taken out of the evaporation apparatus as shown in FIG. 4. The EL material 50 recovered is desirably refined again to increase the purity before being reused. It is also desirable to prevent impurities from mixing in the EL material 50 before refining as much as possible. Therefore the first container 21a is desirably taken out of the evaporation apparatus while sealed in the second container 21b avoiding exposure to the air. Preferably, the first container 21a is kept sealed in the second container 21b during the recovery 51.

By having the material maker recover the EL material 50 remained in the first container 21a, waste of resources is avoided and a relatively expensive EL material can be used or reused efficiently.

This embodiment mode can be combined freely with any one of Embodiment Modes 1 through 3.

[Embodiment Mode 5]

Figure 5:
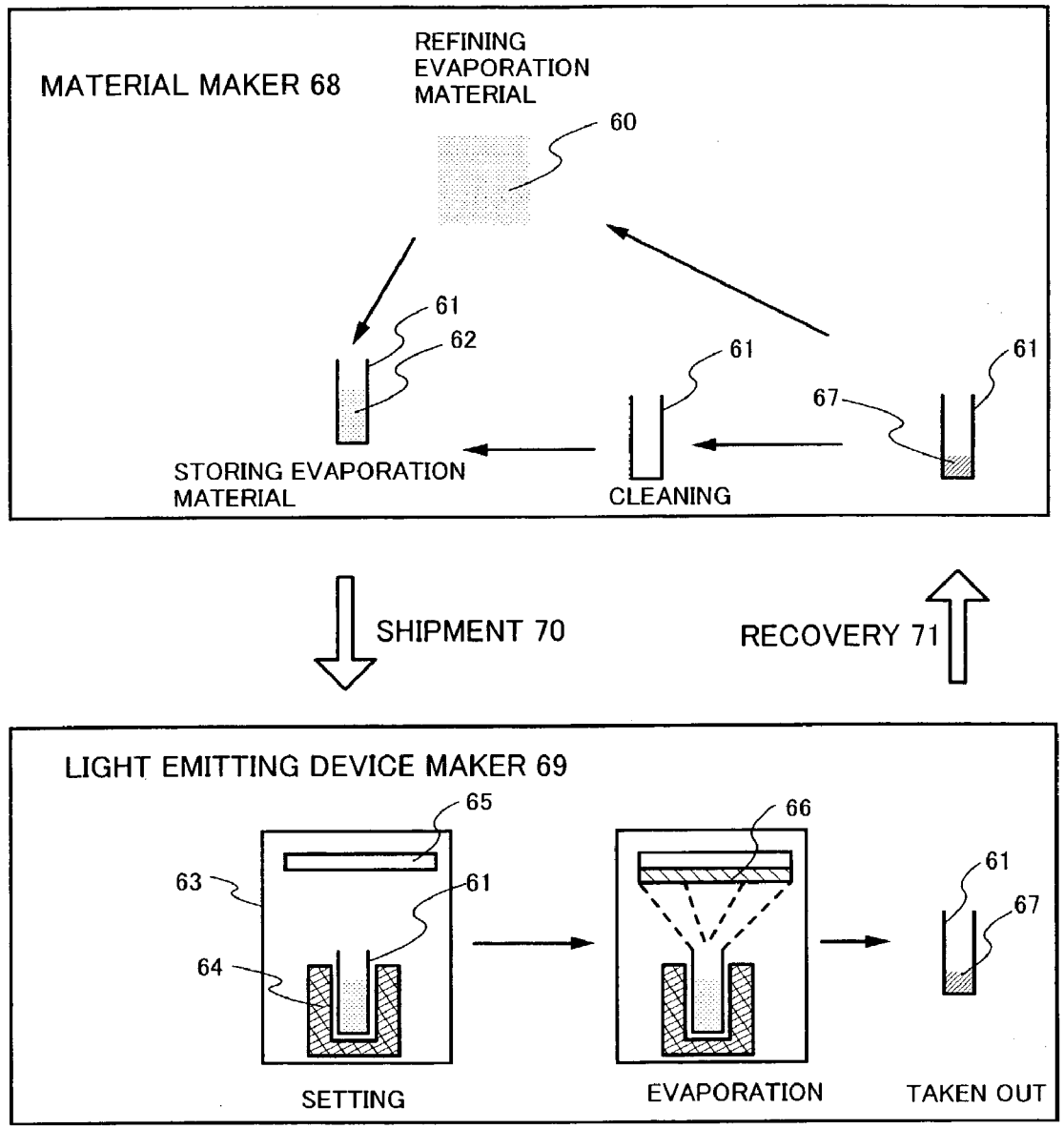
FIG. 5 is a diagram showing Embodiment Mode 5.

This embodiment mode describes with reference to FIG. 5 a manufacturing system that includes recycle of an EL material and recycle of a melting pot.

In FIG. 5, reference symbol 61 denotes a container (melting pot). Denoted by 60 is a powder EL material refined to have high purity. 63 denotes a chamber that can be exhausted of air, 64, heating means, 65, an evaporation object, and 66, an evaporation film. 67 is an EL material remained unevaporated. Further, 68 is a material maker, which is a manufacturer of an organic compound material that is an evaporation material and produces and refines the material (typically a raw material dealer). 69 is a light emitting device maker having an evaporation apparatus, a manufacturer of a light emitting device (typically a factory).

The flow of the recycle system of the present invention will be described below.

First, the material maker 68 refines or produces a powder EL material 60 to give the material high purity.

Next, the material maker 68 stores the refined EL material 62 in a container 61 that is specified by the light emitting device maker 69. Alternatively, the EL material 60 may be refined directly in the container 61. The container 61 is a container that can be set in an evaporation source of an evaporation apparatus as it is, typically, a melting pot, an evaporation boat, or the like.

The container 61 in which the EL material 62 is stored is transferred to the light emitting device maker 69 (shipment 70) and then set in the evaporation chamber 63.

Next, the heating means 64 heats the evaporation material through resistant heating or the like to form an evaporation film 66 on the surface of the evaporation object 65 facing the evaporation source. The thus obtained evaporation film 66 does not contain impurities. A light emitting element formed from this evaporation film 66 can have high reliability and high luminance.

Next, the container 61 is taken out of the evaporation apparatus and is recovered by the material maker 68 (recovery 71). In prior art, a melting pot is discarded after evaporation.

Next, the container 61 is cleaned and the EL material 67 recovered is refined again to increase the purity before it is reused. It is also desirable to prevent impurities from mixing in the EL material 67 before refining as much as possible. In addition, the container 61 is preferably kept sealed in during the recovery 71.

By having the material maker 68 recover the EL material 67 in the container 61 and further reuse the container 61, waste of resources is avoided and a relatively expensive EL material can be used or reused efficiently.

Also, this embodiment mode can be combined freely with any one of Embodiment Modes 1 through 4.

More detailed descriptions will be given on the present invention structured as described above through the following embodiments.

[Embodiment 1]

Figure 6:
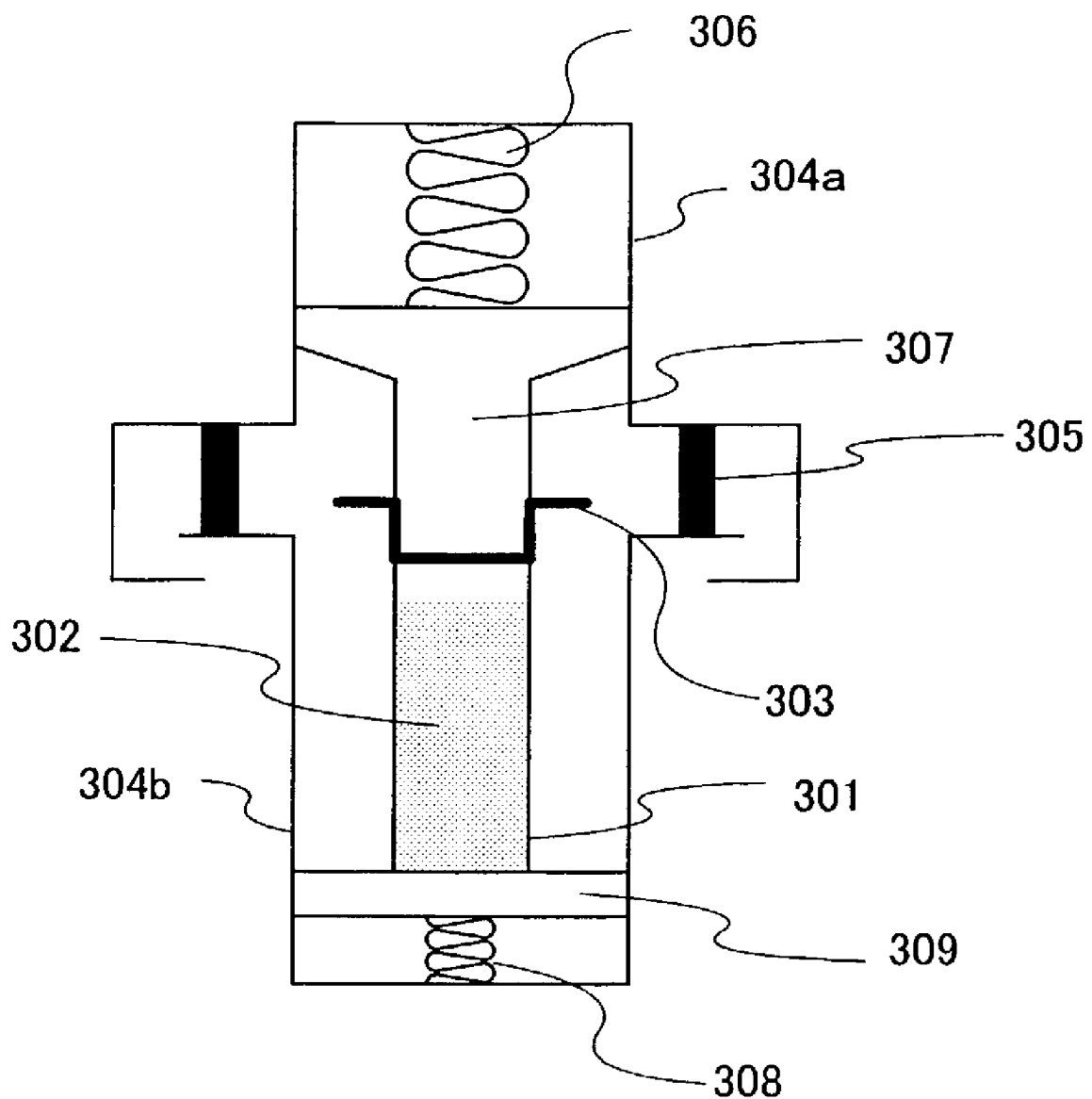
FIG. 6 is a diagram showing Embodiment 1.

This embodiment describes with reference to FIG. 6 an example of the second container shown in Embodiment Modes 1 through 4.

FIG. 6 is a sectional view of the second container in which a first container is stored.

In FIG. 6, reference symbol 301 denotes the first container, typically a melting pot, which stores an EL material 302. The melting pot 301 is lidded with a melting pot lid 303 but the lid is not closed too tightly. The second container is composed of two parts, an upper part 304a and a lower part 304b, which are sealed by an O ring 305 or the like. The upper part 304a is provided with a spring 306 to make an upper lid 307 movable. The lower part 304b is provided with a spring 308 to make a lower lid 309 movable. The melting pot 301 is arranged such that it is sandwiched between the upper lid 307 and a lower lid 309. The lower lid 309 has a convex portion (not shown in the drawing) to which the melting pot 301 is fixed. The melting pot lid 303 is depressed by the upper lid 307. The melting pot lid and the upper lid may be integrated into one.

The upper and lower parts 304a and 304b of the second container are filled with inert gas (typically nitrogen).

The second container is put in a process chamber that can be vacuum-exhausted. When the chamber is vacuum-exhausted, the difference in internal pressure and external pressure causes the spring to exert its resilience and push the upper part 304a off. At the same time, the melting pot 301 is pushed out by the resilience of the spring. As described, the second container shown in FIG. 6 can be opened relatively easily by changing the atmospheric pressure to vacuum. This enables a robot or the like to carry out works after the container is opened, for example, removing the upper part 304a and the melting pot lid 303 and taking the first container out. The second container shown in FIG. 6 is also strong against impact and therefore suitable for transportation.

This embodiment mode can be combined freely with any one of Embodiment Modes 1 through 5.

[Embodiment 2]

Figure 7A:
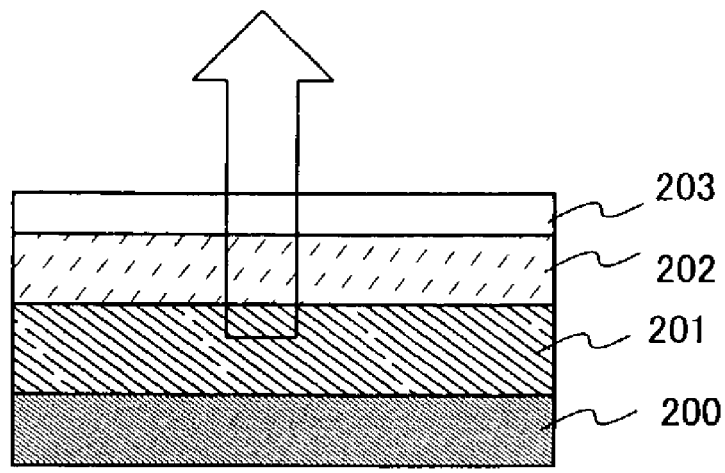
FIGS. 7A and 7B are diagrams showing laminate structures (Embodiment 2)
Figure 7B:
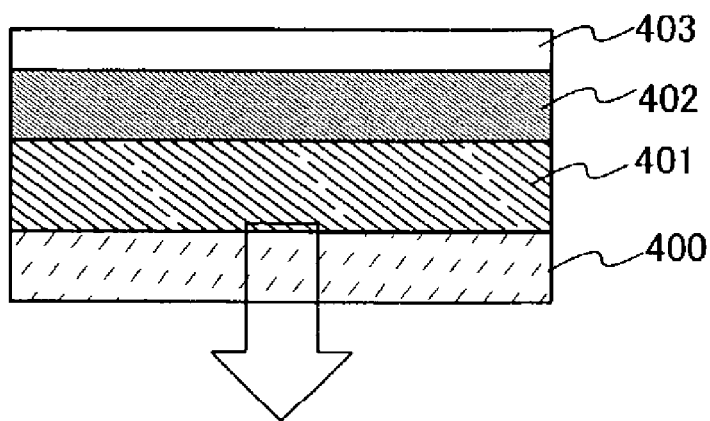

This embodiment describes typical laminate structures of a light emitting element with reference to FIGS. 7A and 7B.

An EL element comprising organic material is light emission caused by excitation of luminescent center due to recombination energy of electrons and holes that are injected from the outside. An EL element comprising organic material typically has a three-layer structure. Here, an element having a two-layer structure (an electron transporting layer and a hole transporting layer) is used for explanation. An electron transporting layer is formed of tris(8-quinolinolate) aluminum (hereinafter referred to as $Alq_3$) or the like. A hole transporting layer is formed of 4,4'-bis[N-(1-naphthyl)N-phenyl-amino]-biphenyl (hereinafter referred to as α-NPD) or the like. ITO is used for an anode and a cathode is formed of MgAg in the example here to describe the light emission mechanism.

When D.C. voltage is applied from the outside to the above EL element having a two-layer structure, holes are injected from the ITO electrode serving as an anode, transported until they reach the interface of the organic compound layer, and injected to the organic compound layer. On the other hand, electrons are injected from the MgAg electrode, transported through the organic compound layer until they reach the vicinity of the interface, and re-combined with the holes in a light emitting molecule. As a result, the light emitting molecule is excited to emit light similar to the fluorescence spectrum of the molecule.

FIG. 7A is a schematic diagram showing an example of the laminate structure of an EL element. In FIG. 7A, reference symbol 200 denotes an anode (or a cathode); 201, an EL layer; 202, a cathode (or an anode); and 203, a protective film. If light is emitted in the direction of the arrow (if emitted light is transmitted through the cathode 202), it is preferable to use for 202 a conductive material transmissive of light, or a very thin metal film (alloy film such as MgAg, MgIn, AlLi, and CaN, or a film formed by co-evaporation of aluminum and an element that belongs to Group 1 or 2 in the periodic table), or a laminate of these films.

The protective film 203 may be an insulating film which is formed by sputtering (DC sputtering or RF sputtering) and which mainly contains silicon nitride or silicon nitroxide. Alternatively, a DLC (diamond like carbon) film containing hydrogen may be used as the protective film. A silicon nitride film is formed using a silicon target in an atmosphere containing nitrogen and argon. A silicon nitride target may be used instead. The protective film 203 may be formed by a film forming device that uses remote plasma. Also, if emitted light is transmitted through the protective film, the film thickness of the protective film is preferably set as small as possible.

A silicon oxide film may be formed prior to the protective film to function as a buffer layer. The silicon oxide film serving as a buffer layer can prevent impurities (such as In, Sn, and Zn) contained in the transparent conductive film from mixing in the silicon nitride film when the silicon nitride film is formed by sputtering by disposing the buffer layer between the transparent conductive film and the silicon nitride film which are otherwise in contact with each other. With the above structure, the buffer layer prevents contamination by impurities (such as In and Sn) from the transparent conductive film and an excellent protective film having no impurities can be formed.

Thus the light emitting element is protected and the reliability thereof is improved.

Also, FIG. 7B is a schematic diagram showing an example of the laminate structure of an EL element. In FIG. 7B, reference symbol 400 denotes an anode (or a cathode); 401, an EL layer; 402, a cathode (or an anode); and 403, a protective film. If light is emitted in the direction of the arrow in the drawing (if emitted light is transmitted through the electrode 400), it is preferable to use for the electrode 400 a conductive material transmissive of light.

This embodiment shows an example in which an evaporation apparatus has six evaporation sources. A first evaporation source has an organic compound capable of injecting holes. A second evaporation source has an organic compound capable of transporting holes. A third evaporation source has an organic compound capable of transporting holes, and this organic compound serves as a host of a luminous organic compound. A fourth evaporation source has a luminous organic compound. A fifth evaporation source has an organic compound capable of blocking carriers. A sixth evaporation source has an organic compound capable of transporting electrons.

Desirably, a microcomputer controls each evaporation source to adjust the film formation speed.

One evaporation source may have more than one organic compounds. For example, an evaporation source may have a luminous organic compound and a well as another organic compound that serves as a dopant. Known organic compounds can be used to form an organic compound film which has plural functions as above described and which emits red light.

In this embodiment, the first evaporation source has as an organic compound capable of injecting holes copper phthalocyanine (hereinafter referred to as Cu-Pc). The second evaporation source has as an organic compound capable of transporting holes 4,4'-bis[N-(1-naphthyl)-N-phenylamino]-biphenyl (hereinafter referred to as α-NPD). The third evaporation source has as an organic compound that serves as a host (hereafter called a host material) 4,4'-dicarbazole-biphenyl (hereinafter referred to as CBP). The fourth evaporation source has as a luminous organic compound 2, 3, 7, 8, 12, 13, 17, 18-octaethyl-21H, 23H-porphyrin-platinum (hereinafter referred to as PtOEP). The fifth evaporation source has as an organic compound capable of blocking carriers bathocuproin (hereinafter referred to as BCP). The sixth evaporation source has as an organic compound capable of transporting electrons tris(8-quinolinolate) aluminum (hereinafter referred to as $Alq_3$).

These organic compounds are evaporated in order. As a result, an organic compound film that is sectioned into regions having a hole injection function, a hole transporting function, a light emitting function, and an electron transporting function is formed on the anode.

The above example is for forming an organic compound film that emits red light. In order to form an organic compound film that emits green light, the first evaporation source has as an organic compound capable of injecting holes Cu-Pc, the second evaporation source has as an organic compound capable of transporting holes MTDATA, the third evaporation source has as an organic compound capable of transporting holes α-NPD, the fourth evaporation source has as a host material capable of transporting holes CBP. The fifth evaporation source has as a luminous organic compound tris(2-phenylpyridine) iridium (hereinafter referred to as $Ir(ppy)_3$), the sixth evaporation source has as an organic compound capable of blocking carriers BCP, and the seventh evaporation source has as an organic compound capable of transporting electrons $Alq_3$. These organic compounds are evaporated in order. As a result, an organic compound film that is sectioned into regions having a hole transporting function, a light emitting function, a blocking function, and an electron transporting function is formed on the anode.

To form an organic compound film that emits blue light, the first evaporation source has as an organic compound capable of injecting holes Cu-Pc, the second evaporation source has as a luminous organic compound α-NPD, the third evaporation source has as an organic compound capable of blocking carriers BCP, and the fourth evaporation source has as an organic compound capable of transporting electrons $Alq_3$. These organic compounds are evaporated in order. As a result, an organic compound film that is sectioned into regions having a hole injection function, a light emitting function, a blocking function and an electron transporting function is formed on the anode.

The protective film 403 is an insulating film which is formed by sputtering (DC sputtering or RF sputtering) and which mainly contains silicon nitride or silicon nitroxide. Alternatively, a DLC film containing hydrogen may be used as the protective film. A silicon nitride film is formed using a silicon target in an atmosphere containing nitrogen and argon. A silicon nitride target may be used instead. The protective film 403 may be formed by a film forming device that uses remote plasma. A silicon oxide film may be formed on the protective film to function as a buffer layer.

With this structure, a light emitting element is protected and the reliability thereof is improved.

This embodiment is applicable not only to an active matrix display device but also to a passive display device.

This embodiment can be combined freely with Embodiment Modes 1 through 5 or Embodiment 1.

[Embodiment 3]

Figure 8:
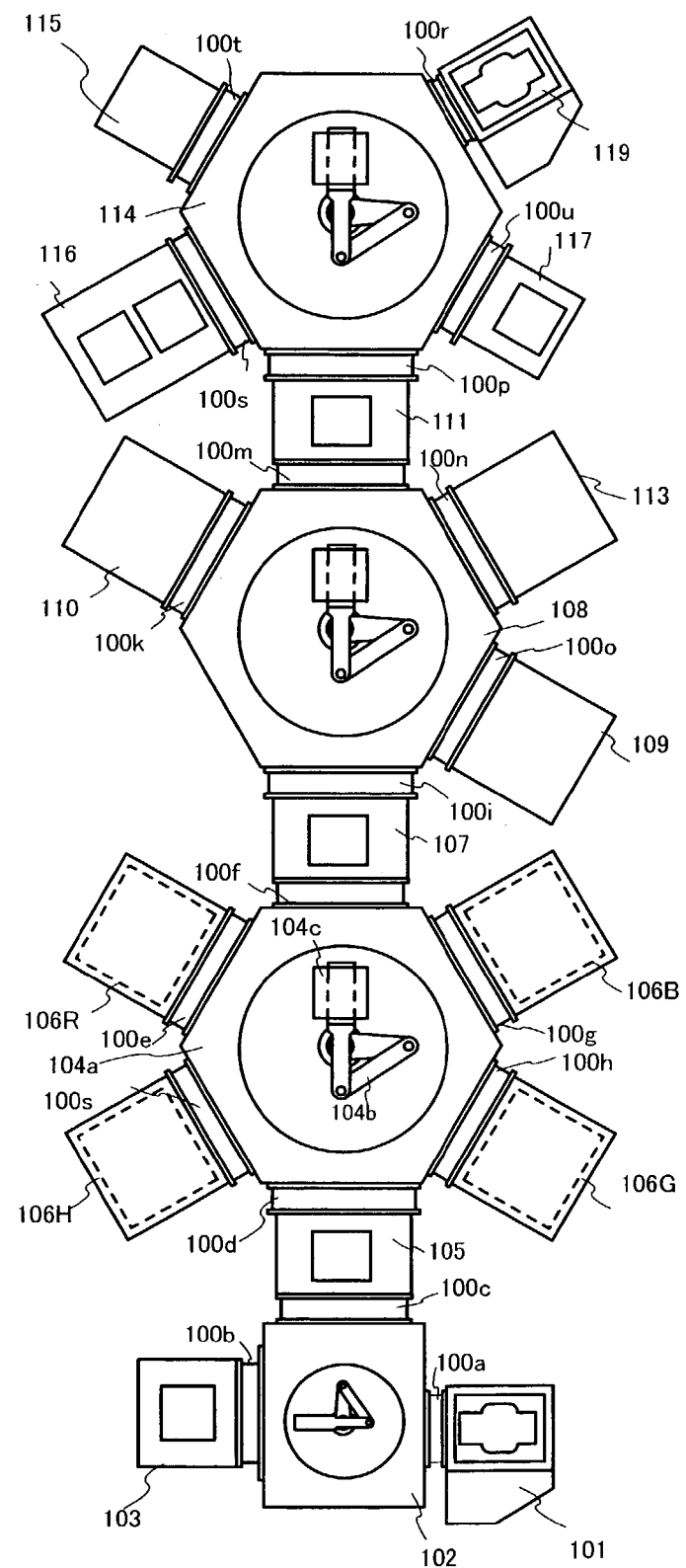
FIG. 8 is a diagram showing a multi-chamber type manufacturing apparatus.

This embodiment gives with reference to FIG. 8 an example of a multi-chamber type manufacturing apparatus in which a manufacturing process up to forming an upper electrode is automated.

In FIG. 8, 100a to 100k, 100m to 100p, and 100r to 100u represent gates, 101 represents a preparation chamber, and 119, a take-out chamber. 102, 104a, 108, and 114 are transfer chambers. 105, 107, and 111 are handing-over chambers. 106R, 106B, 106G, 106H, 109, 110, and 113 are film forming chambers. 103 represents a pre-treatment chamber, 117, a sealing substrate loading chamber, 115, a dispenser chamber, and 116, a sealing chamber.

Shown below is a procedure of bringing a substrate having a TFT previously provided thereon into the manufacturing apparatus shown in FIG. 8 and forming a laminate structure shown in FIG. 7A.

First, a substrate on which a TFT and an anode 200 are formed is set in the preparation chamber 101. The preparation chamber 101 is connected to a vacuum exhaust process chamber and, preferably, set to the atmospheric pressure by introducing inert gas into the chamber after the chamber is vacuum-exhausted. The substrate is then transferred to the transfer chamber 102 that is connected to the preparation chamber 101. The transfer chamber is vacuum-exhausted in advance and remains vacuum, so that the chamber contains as little moisture and oxygen as possible.

The transfer chamber 102 is connected to a vacuum exhaust process chamber for exhausting the chamber of air. The vacuum exhaust process chamber is provided with a magnetic levitation turbomolecular pump, a cryopump, or a dry pump. The pump makes it possible for the transfer chamber to reach a vacuum level of $10^{-5}$ to $10^{-6}$ Pa. Also, reverse diffusion of impurities from the pump side and the exhaust system can be prevented. In order not to let impurities enter the interior of the device, inert gas such as nitrogen or noble gas is introduced. The gas introduced into the device has to have high purity and is refined by a gas refining machine prior to introduction to the device interior. Accordingly, a gas refining machine is needed to give the gas high purity before it is introduced into the film forming device. In this way, oxygen, moisture, and other impurities are removed from the gas in advance and these impurities are prevented from entering the device.

Preferably, annealing for degasification is conducted in vacuum to remove moisture and gas from the substrate. The substrate is transferred from the transfer chamber 102 to the adjoining pretreatment chamber 103, where the substrate is subjected to annealing. If it is necessary to clean the anode surface, the substrate is transferred from the transfer chamber 102 to the adjoining pretreatment chamber 103 for the cleaning.

If necessary, a high-molecular weight organic compound layer may be formed on the anode covering the entire surface. The manufacturing apparatus of FIG. 8 may have a film forming chamber for forming a high-molecular weight organic compound layer. When the film is formed by spin coating, the ink jet method, or spraying, the substrate is set with its film forming side facing downward in the atmospheric pressure. The handing-over chamber 105 has a substrate inverting mechanism and inverts the substrate suitably. If an aqueous solution is used to form the film, the substrate on which the film is formed is transferred to the pretreatment chamber 103 where the substrate is subjected to heat treatment in vacuum to vaporize the moisture in the film.

Next, the substrate 104c is transferred from the transfer chamber 102 to the handing-over chamber 105 without exposing the substrate to the air. Then the substrate 104c is transferred to the transfer chamber 104, where a transfer mechanism 104b transports the substrate to the film forming chamber 106R. An EL layer for emitting red light is suitably formed on the anode 200 in the film forming chamber 106R. In the example shown here, the EL layer is formed by evaporation. Before the substrate is brought in the film forming chamber 106R, the substrate is set with its film forming side facing downward in the handing-over chamber 105 and the film forming chamber 106R is vacuum-exhausted.

For example, the film forming chamber 106R is vacuum-exhausted for evaporation to reach a vacuum level of $5\times10^{-3}$ Torr (0.665 Pa) or lower, preferably, $10^{-4}$ to $10^{-6}$ Pa. Prior to evaporation, the organic compound is vaporized by resistance heating and the vaporized organic compound is scattered toward the substrate when a shutter (not shown in the drawing) is opened for evaporation. The vaporized organic compound is scattered upward, passes through an opening (not shown in the drawing) in a metal mask (not shown in the drawing), and is deposited on the substrate. During evaporation, the substrate temperature ($T_1$) is set to 50 to 200° C., preferably 65 to 150° C., by substrate heating means.

In this embodiment, a melting pot in which an evaporation material is stored in advance by a material maker is set in each of the film forming chambers 106R, 106B, 106G, and 110. Preferably, a melting pot is set in a film forming chamber while avoiding contact with the air. A melting pot shipped from a material maker is preferably sealed in a second container as the one shown in Embodiment 1 during shipment and is introduced into a film forming chamber in that state. Desirably, a chamber having vacuum exhaust means is connected to the film forming chamber 106R, the melting pot is taken out of the second container in vacuum or in an inert gas atmosphere in this chamber, and then the melting pot is set in the film forming chamber. In this way, a melting pot and an EL material stored in the melting pot are protected from contamination.

When three kinds of EL layers are formed for a full-color image, an organic compound film for emitting red light is formed in the film forming chamber 106R, an organic compound film for emitting green light is formed in the film forming chamber 106G, and then an organic compound film for emitting blue light is formed in the film forming chamber 106B.

After a desired EL layer 201 is formed on the anode 200, the substrate is transferred from the transfer chamber 104a to the handing-over chamber 107 without exposing the substrate to the air. The substrate is then transferred from the handing-over chamber 107 to the transfer chamber 108 while avoiding contact with the air.

Next, a transfer mechanism provided in the transfer chamber 108 brings the substrate to the film forming chamber 110 to form a thin metal layer on the EL layer 201. The substrate is then transferred to the film forming chamber 109 to form a transparent conductive film. The thin metal layer and the transparent conductive film form a laminate to suitably form a cathode 202. Here, the film forming chamber 110 is an evaporation apparatus having Mg and Ag as an evaporation source and the film forming chamber 109 is a sputtering device having at least a target made of a transparent conductive material.

The substrate is next transferred from the transfer chamber 108 to the film forming chamber 113 to form a protective film 203. Here, the film forming chamber 113 is a sputtering device having a silicon target or a silicon nitride target. A silicon nitride film is formed as the protective film by making the atmosphere of the film forming chamber a nitrogen atmosphere or an atmosphere containing nitrogen and argon.

Through the above steps, the laminate structure shown in FIG. 7A, namely, a light emitting element covered with a protective film is formed on a substrate.

Subsequently, the substrate on which the light emitting element is formed is transferred from the transfer chamber 108 to the handing-over chamber 111, and to the transfer chamber 114 without exposing the substrate to the air.

From the transfer chamber 114, the substrate on which the light emitting element is formed is transferred to the sealing chamber 116. It is preferable to prepare in advance in the sealing chamber 116 a sealing substrate on which a sealing member is formed.

The sealing substrate is set in the sealing substrate loading chamber 117 from the outside. Preferably, the sealing substrate is subjected to annealing in vacuum beforehand in, for example, the sealing substrate loading chamber 117 in order to remove moisture and other impurities. To form the sealing member on the sealing substrate, the transfer chamber 114 is set to the atmospheric pressure, the sealing substrate is transferred from the sealing substrate loading chamber to the dispenser chamber 115, and then the sealing member for bonding the sealing substrate to the substrate on which the light emitting element is formed is formed. The sealing substrate on which the sealing member is formed is transferred to the sealing chamber 116.

Next, the substrate on which the light emitting element is formed is degasified by annealing in vacuum or in an inert gas atmosphere. Then the substrate on which the light emitting element is formed and the sealing substrate on which the sealing member is formed are bonded to each other. The sealed space between the substrates is filled with inert gas. In the example shown here, the sealing member is formed on the sealing substrate. However, there is no particular limitation and the sealing member may be formed on the substrate that has the light emitting element formed thereon.

The sealing member is cured by using a UV ray irradiation mechanism that is provided in the sealing chamber 116 to irradiate the pair of bonded substrates with UV light. Although the sealing member here is a UV-curable resin, there is no particular limitation and any adhesive can be used as the sealing member.

Then the pair of bonded substrates is transferred from the sealing chamber 116 to the transfer chamber 114, and to the take-out chamber 119, where the pair of substrates is taken out of the device.

As described, the use of the manufacturing apparatus shown in FIG. 8 makes it possible to avoid exposure of a light emitting element to the air before the light emitting element is completely sealed in an airtight space. Therefore a light emitting device of high reliability can be manufactured. The device also makes it possible to set an evaporation material automatically since it only has to set a melting pot in which an evaporation material is stored in advance. In the transfer chamber 114, vacuum is alternated with a nitrogen atmosphere at the atmospheric pressure repeatedly. On the other hand, the transfer chambers 102, 104a, and 108 are desirably vacuum all the time.

The manufacturing apparatus may be an in-line film forming device.

The description given below is about a procedure of forming a laminate structure shown in FIG. 7B after a substrate on which a TFT and an anode are already formed is brought into the manufacturing apparatus shown in FIG. 8.

First, a substrate on which a TFT and an anode 400 are formed is set in the preparation chamber 101. In order to remove as much moisture and oxygen as possible in advance, it is preferable to set the preparation chamber 101 to the atmospheric pressure by introducing inert gas into the chamber after the chamber is vacuum-exhausted. The substrate is then transferred to the transfer chamber 102 that is connected to the preparation chamber 101. The anode 400 is formed of a transparent conductive material, such as an indium tin compound or zinc oxide. Then the substrate is transferred from the transfer chamber 102 to the adjoining pretreatment chamber 103, where anode surface is subjected to cleaning, oxidization treatment, heat treatment, or the like. For anode surface cleaning, UV ray irradiation in vacuum or oxygen plasma treatment is employed. For oxidization treatment, the substrate is irradiated with UV rays in an atmosphere containing oxygen while heating the substrate at 100 to 120° C. Oxidization treatment is effective when the anode is an oxide such as ITO (or IZO). For heat treatment, the substrate is heated in vacuum at a temperature equal to or higher than 50° C. but not over the highest temperature the substrate can withstand, preferably 65 to 150° C. Through the heat treatment, oxygen, moisture, and other impurities adhered to the substrate and contained in the films formed on the substrate are removed. Heating in vacuum prior to evaporation is particularly effective since EL materials are readily degraded by impurities such as oxygen and moisture.

If necessary, a hole transporting layer or hole injection layer that is one layer constituting an EL layer is formed on the anode 400 by transferring the substrate 104c without exposing it to the air from the transfer chamber 102 to the handing-over chamber 105 and to the transfer chamber 104a from which a transfer mechanism 104b brings the substrate to the film forming chamber 106H. A hole injection layer and a hole transporting layer both may be formed in the film forming chamber 106H. In the example shown here, the EL layer is formed by evaporation. The substrate is set in the film forming chamber 106H with its film forming side facing downward. Preferably, the film forming chamber is vacuum-exhausted before the substrate is brought in.

Next, the substrate is transferred to the film forming chamber 106R to form on the anode 400 an EL layer that emits red light. In the example shown here, the EL layer is formed by evaporation. Before the substrate is brought in the film forming chamber 106R, the substrate is set with its film forming side facing downward in the handing-over chamber 105 and the film forming chamber 106R is vacuum-exhausted.

For example, the film forming chamber 106R is vacuum-exhausted for evaporation to reach a vacuum level of $5 \times 10^{-3}$ Torr (0.665 Pa) or lower, preferably, $10^{-4}$ to $10^{-6}$ Pa. Prior to evaporation, the organic compound is vaporized by resistance heating and the vaporized organic compound is scattered toward the substrate when a shutter (not shown in the drawing) is opened for evaporation. The vaporized organic compound is scattered upward, passes through an opening (not shown in the drawing) in a metal mask (not shown in the drawing), and is deposited on the substrate. During evaporation, the substrate temperature ($T_1$) is set to 50 to 200° C., preferably 65 to 150° C., by substrate heating means.

A melting pot in which an evaporation material is stored in advance by a material maker is set in a film forming chamber. Preferably, the melting pot is set in the film forming chamber while avoiding contact with the air. A melting pot shipped from a material maker is preferably sealed in a second container as the one shown in Embodiment 1 during shipment and is introduced into a film forming chamber in that state. Desirably, a chamber having vacuum exhaust means is connected to the film forming chamber 106R, the melting pot is taken out of the second container in vacuum or in an inert gas atmosphere in this chamber, and then the melting pot is set in the film forming chamber. In this way, the melting pot and the EL material stored in the melting pot are protected from contamination.

When three kinds of EL layers are formed for a full-color image, an organic compound film for emitting red light is formed in the film forming chamber 106R, an organic compound film for emitting green light is formed in the film forming chamber 106G, and then an organic compound film for emitting blue light is formed in the film forming chamber 106B.

After a desired EL layer 401 is formed on the anode 400, the substrate is transferred from the transfer chamber 104a to the handing-over chamber 107 without exposing the substrate to the air. The substrate is then transferred from the handing-over chamber 107 to the transfer chamber 108 while avoiding exposure to the air.

If necessary, a film serving as a hole injection layer is formed on the anode 400 covering the entire surface from an aqueous solution of poly(ethylene dioxythiophene)/poly(styrene sulfonic acid) (referred to as PEDOT/PSS). The manufacturing apparatus of FIG. 8 may have a film forming chamber for forming a high-molecular weight organic compound layer. When the film is formed by spin coating, the ink jet method, or spraying, the substrate is set with its film forming side facing upward in the atmospheric pressure. The handing-over chamber 105 inverts the substrate suitably. When an aqueous solution is used to form the film, the substrate on which the film is formed is transferred to the pretreatment chamber 103 where the substrate is subjected to heat treatment in vacuum to vaporize the moisture in the film.

Next, a transfer mechanism provided in the transfer chamber 108 brings the substrate to the film forming chamber 110 to form on the EL layer 401 a metal layer that serves as a cathode 402. Here, the film forming chamber 110 is an evaporation apparatus having AlLi as an evaporation source.

The substrate is next transferred from the transfer chamber 108 to the film forming chamber 113 to form a protective film 403 on the cathode 402 without being exposed to the air. Here, the film forming chamber 113 is a sputtering device having a silicon target or a silicon nitride target. A silicon nitride film is formed as the protective film in a nitrogen atmosphere or an atmosphere containing nitrogen and argon.

Through the above steps, the laminate structure shown in FIG. 7B, namely, a light emitting element covered with a protective film is formed on a substrate.

The subsequent steps are identical with those of the above-described manufacturing procedure of a light emitting device that has the laminate structure shown in FIG. 7A. Accordingly, explanations thereof are omitted here.

As described, the manufacturing apparatus shown in FIG. 8 can provide the laminate structure of FIG. 7A and the laminate structure of FIG. 7B both.

Also, this embodiment can be combined freely with Embodiment Modes 1 through 5 or Embodiment 1 or 2.

[Embodiment 4]

Figure 9A:
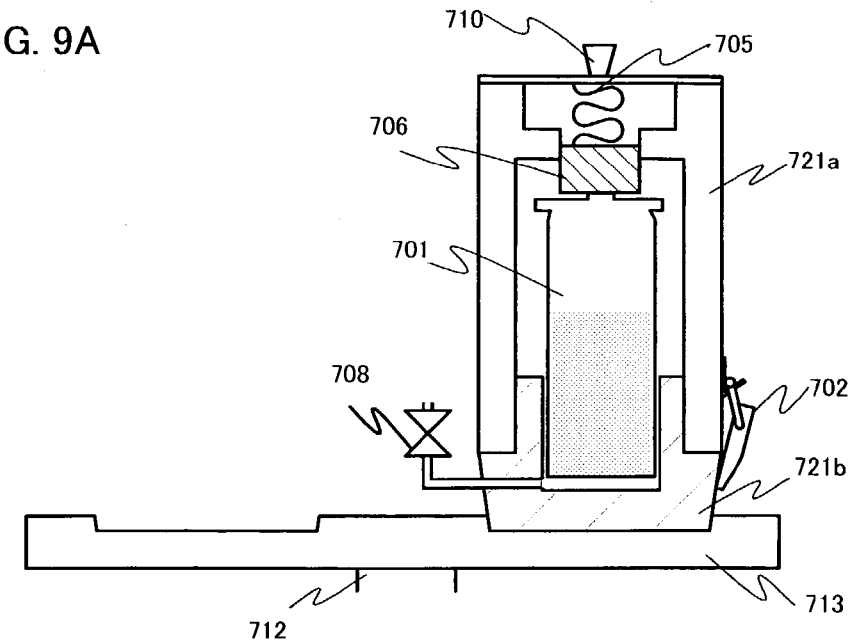
FIGS. 9A and 9B are diagrams showing transfer of a melting pot in a setting chamber.

This embodiment gives a specific description of a mode of container for transportation with reference to FIG. 9A. The container used for transportation is a second container and is divided into an upper part (721a) and a lower part (721b). The second container has fixing means 706, a spring 705, a handle 710, a gas inlet 708, an O ring, and a clasp 702. The fixing means 706 is provided in the upper part of the second container to fix a first container. The spring 705 pressurizes the fixing means. The gas inlet 708 is provided in the lower part of the second container and serves as a gas path to keep the second container depressurized. The O ring fixes the upper part 721a and the lower part 721b to each other. A first container 701 in which a refined evaporation material is sealed is set in the second container. The second container may be formed of a material containing stainless steel. The first container 701 may be formed of a material containing titanium.

A material maker seals a refined evaporation material in the first container 701. Then the first container 701 is sealed in the second container by putting the upper part 721a and the lower part 721b together with the O ring and fixing the upper part 721a and the lower part 721b with the clasp 702. After that, the pressure in the second container is reduced and the atmosphere is changed to a nitrogen atmosphere through the gas inlet 708. Adjusting the spring 705, the first container 701 is fixed by the fixing means 706. A desiccant may be put in the second container. By keeping the interior of the second container exhausted, or depressurized and in a nitrogen atmosphere as this, even the slightest amount of oxygen or water is prevented from contacting the evaporation material.

The container is transferred in this state to a light emitting device maker, where the first container 701 is set in an evaporation chamber. Thereafter, the evaporation material is sublimated by heating to form an evaporation film.

Preferably, other parts, for example, a film thickness monitor (quartz oscillator or the like) and a shutter are also shipped and set in the evaporation apparatus without exposing them to the air.

In this embodiment, a setting chamber is connected to a film forming chamber where a melting pot (filled with an evaporation material) which is vacuum-sealed in a container is taken out of the container and set in an evaporation source holder in the setting chamber while avoiding contact to the air. The melting pot is transferred from the setting chamber by a transfer robot without exposing the pot to the air. Preferably, the setting chamber too has vacuum exhaust means and means for heating a melting pot is also provided in the setting chamber.

Figure 9B:
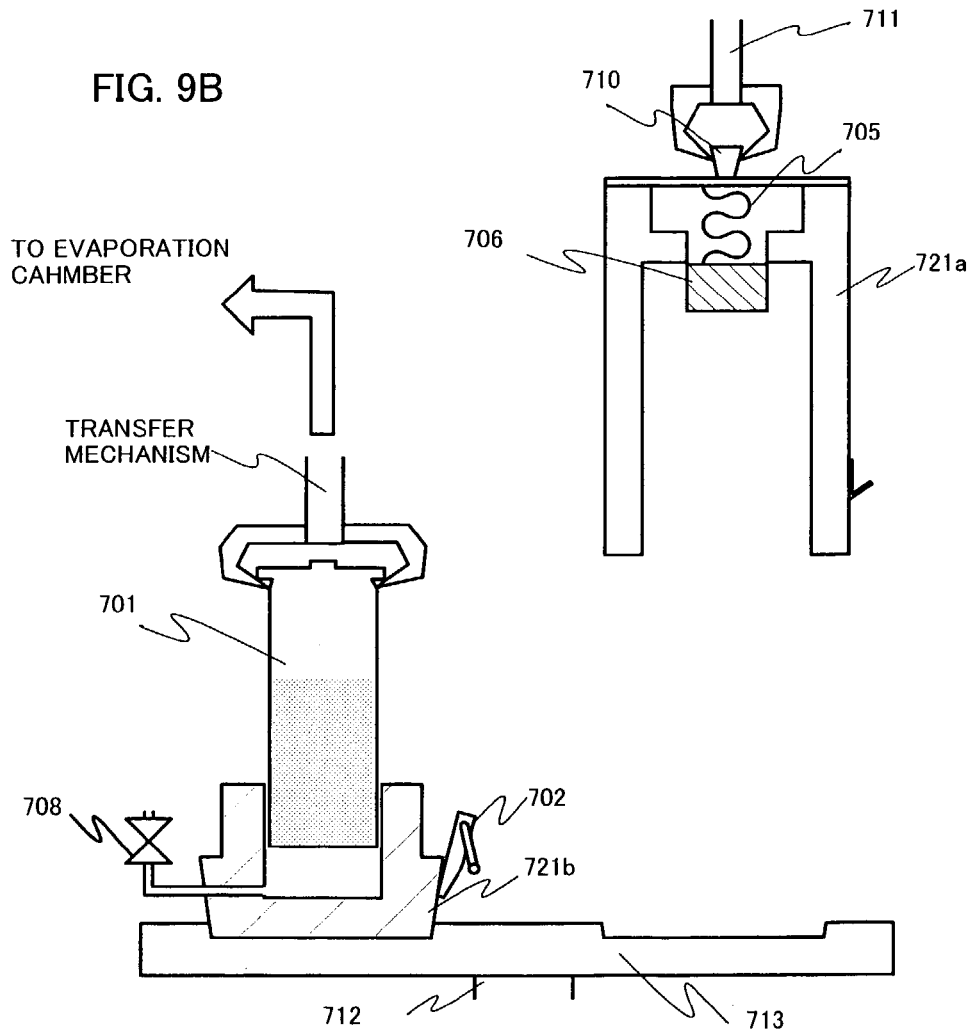

A mechanism for transferring the first container 701 sealed in the second container 721 to a film forming chamber is described referring to FIGS. 9A and 9B.

FIG. 9A shows in section a setting chamber 705 that has a rotating mount 713, a transfer mechanism, and a lifting mechanism 711. The rotating mount 713 is for mounting the second container 721 in which the first container is stored. The transfer mechanism transports the first container. The setting chamber is adjacent to the film forming chamber. The atmosphere in the setting chamber can be controlled by atmosphere controlling means through a gas inlet. The transfer mechanism of this embodiment is not limited to the one shown in FIG. 9B which swoops down to the first container 701 and picks it up for transportation by gripping the head of the container. The transfer mechanism may transport the first container by clutching the container at the sides.

In this setting chamber, the second container is placed on the rotating mount 713 with the clasp 702 undone. Since the interior is vacuum, the container does not fall apart when the clasp 702 is undone. Then the pressure in the setting chamber is reduced by the atmosphere controlling means. As the pressure in the setting chamber and the pressure in the second container become equal to each other, the second container becomes ready to open. The upper part 721a of the second container is taken off by the lifting mechanism 711 and the rotating mount 713 rotates around a rotary axis 712 to move the lower part 721b of the second container and the first container. The first container 701 is then transferred by the transfer mechanism to the evaporation chamber where the first container 701 is set in the evaporation source holder (not shown in the drawing).

Thereafter, the evaporation material is sublimated by the heating means provided in the evaporation source holder to start film formation. The sublimated evaporation material is scattered toward the substrate as a shutter (not shown in the drawing) provided in the evaporation source holder is opened during film formation. The scattered evaporation material is deposited on the substrate to form a light emitting layer (including a hole transporting layer, a hole injection layer, an electron transporting layer, and electron injection layer).

After the evaporation is completed, the first container is lifted off of the evaporation source holder and is transferred to the setting chamber. The first container is then put in the lower part (not shown in the drawing) of the second container that is set on the rotating mount 713 and is sealed in the second container by putting the upper part 721a of the second container in place. Preferably, the first container is sealed in the same second container (the upper part and the lower part both) in which it has been shipped to the light emitting device maker. After the first container is sealed in the second container, the setting chamber is set to the atmospheric pressure. The second container is then taken out of the setting chamber, fastened with the clasp 702, and transferred to the material maker.

Figure 10A:
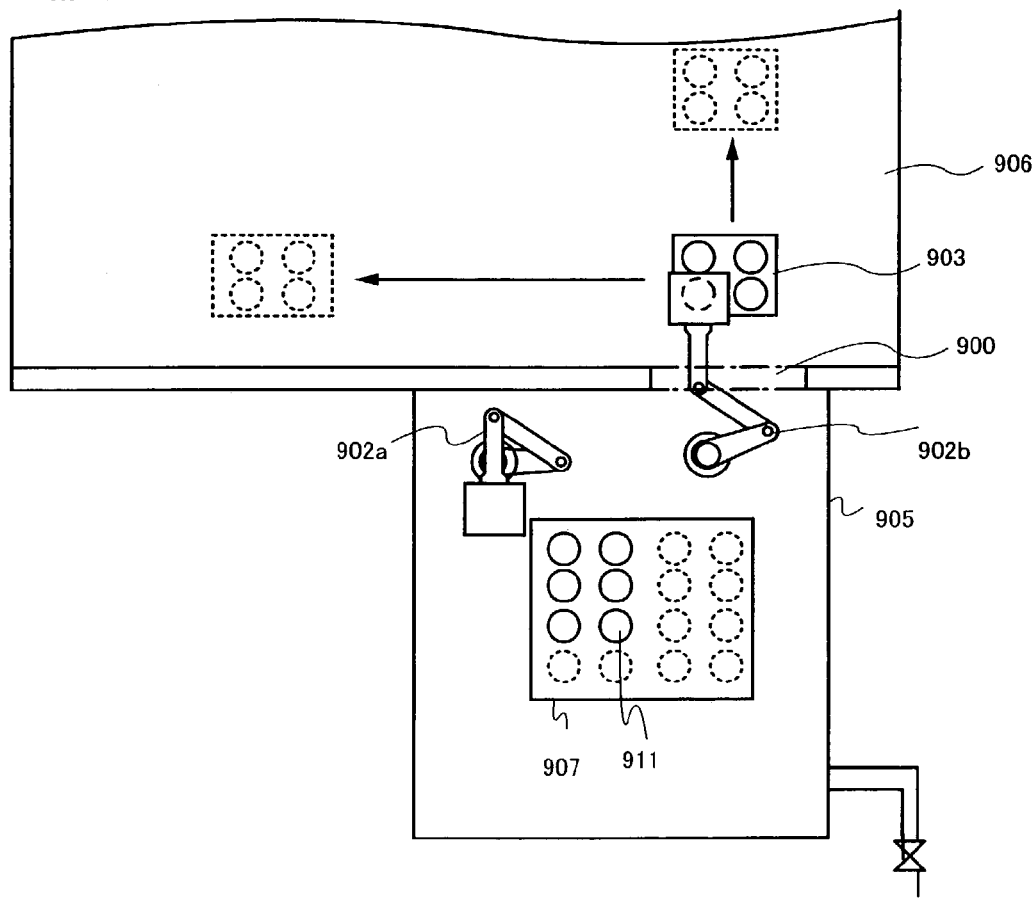
FIGS. 10A and 10B are diagrams showing transportation of a melting pot to an evaporation source holder in a setting chamber.
Figure 10B:
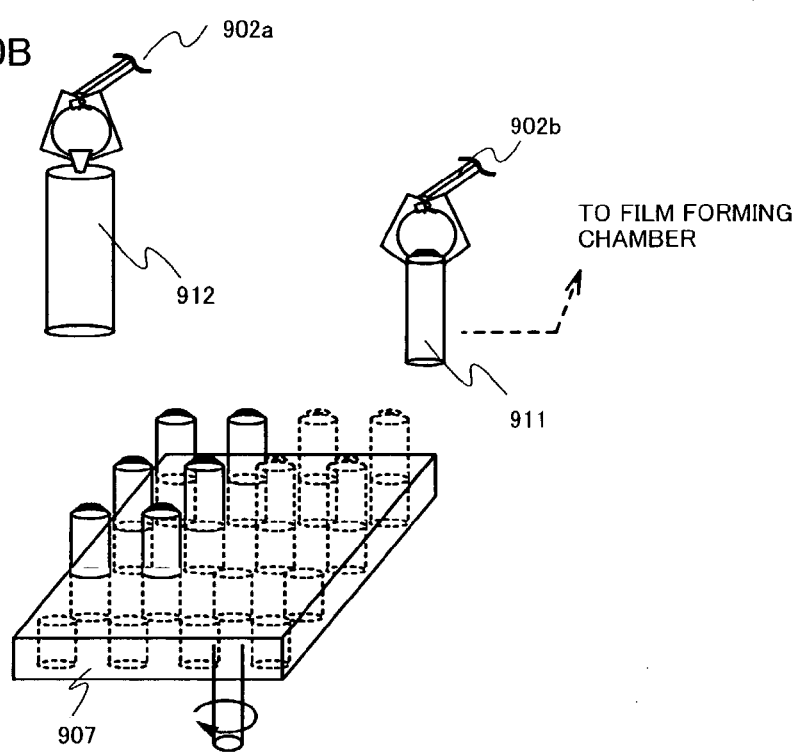

FIGS. 10A and 10B show an example of a setting chamber in which more than one first container 701 can be set. In FIGS. 10A and 10B, a setting chamber 905 has a rotating base 907 on which plural first containers 911 or second containers 912 can be set, a transfer mechanism 902b for transferring a first container, and a lifting mechanism 902a. A film forming chamber 906 has an evaporation source holder 903 and a mechanism for moving the evaporation holder (the mechanism is not shown in the drawing). FIG. 10A is a top view of the setting chamber and FIG. 10B is a perspective view of the interior of the setting chamber. The setting chamber 905 and the film forming chamber 906 are adjoined to each other through a gate valve 900. The atmosphere of the setting chamber can be controlled by atmosphere controlling means through a gas inlet. The upper part of the second container 912 is taken off and is set aside in a separate place, though the place is not shown in the drawing.

Alternatively, a robot may be provided in a pretreatment chamber (setting chamber) connected to a film forming chamber to move the whole evaporation source from the film forming chamber to the pretreatment chamber and set an evaporation material in the evaporation source in the pretreatment chamber. In this way, an evaporation source can be set while keeping the film forming chamber clean.

Also, this embodiment can be combined freely with any one of Embodiment Modes 1 through 5 and Embodiments 1 through 3.

[Embodiment 5]

Figure 11:
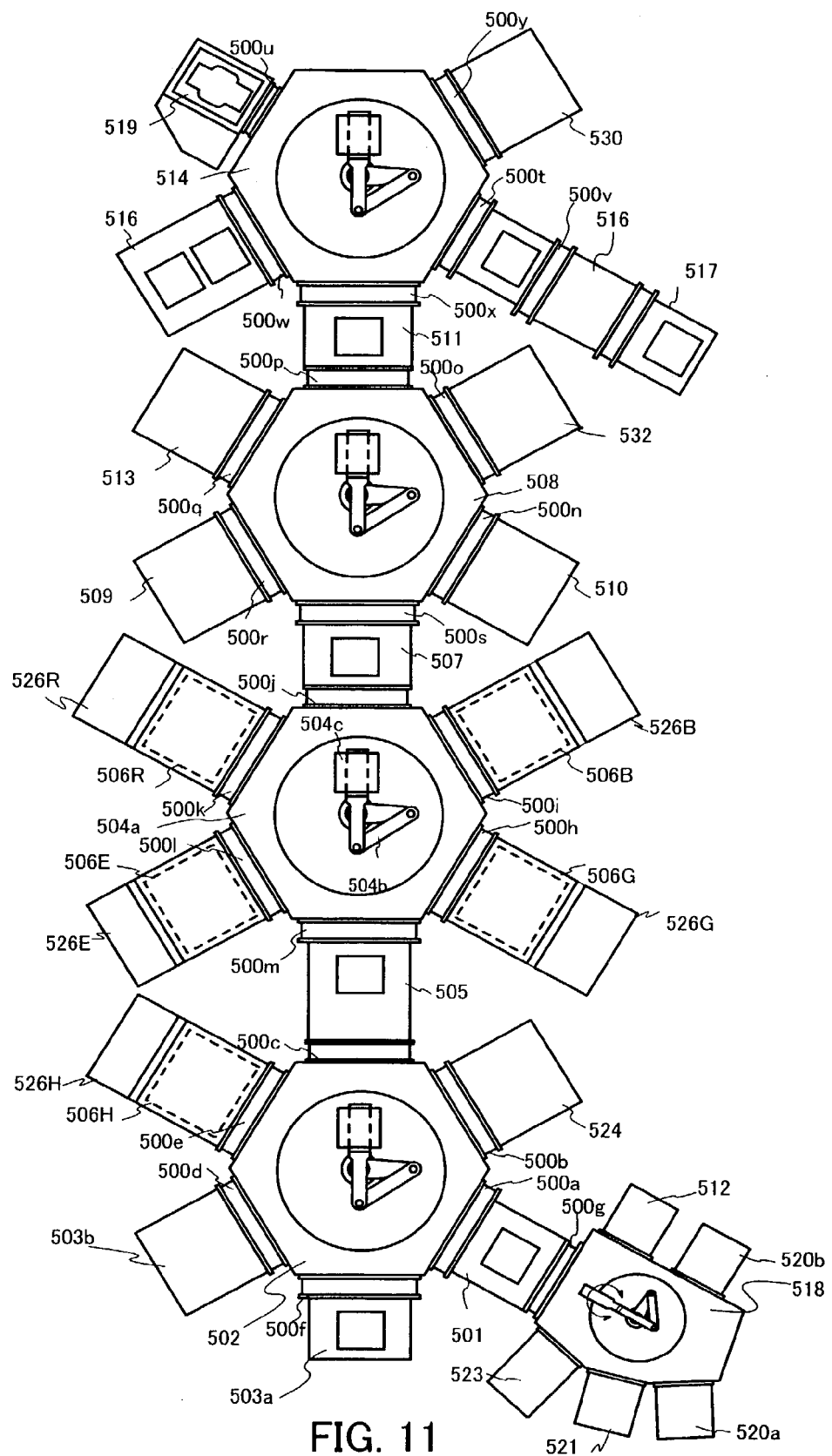
FIG. 11 is a diagram showing a multi-chamber type manufacturing apparatus (Embodiment 5)
Figure 12A:
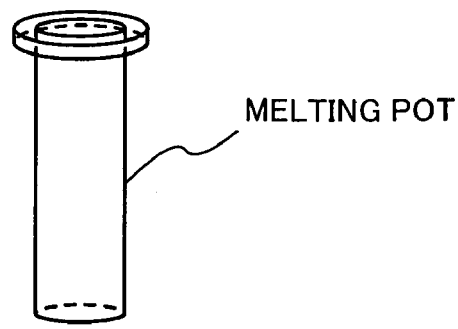
FIGS. 12A and 12B are an exterior view of a melting pot and a simplified diagram of an evaporation apparatus, respectively.
Figure 12B:
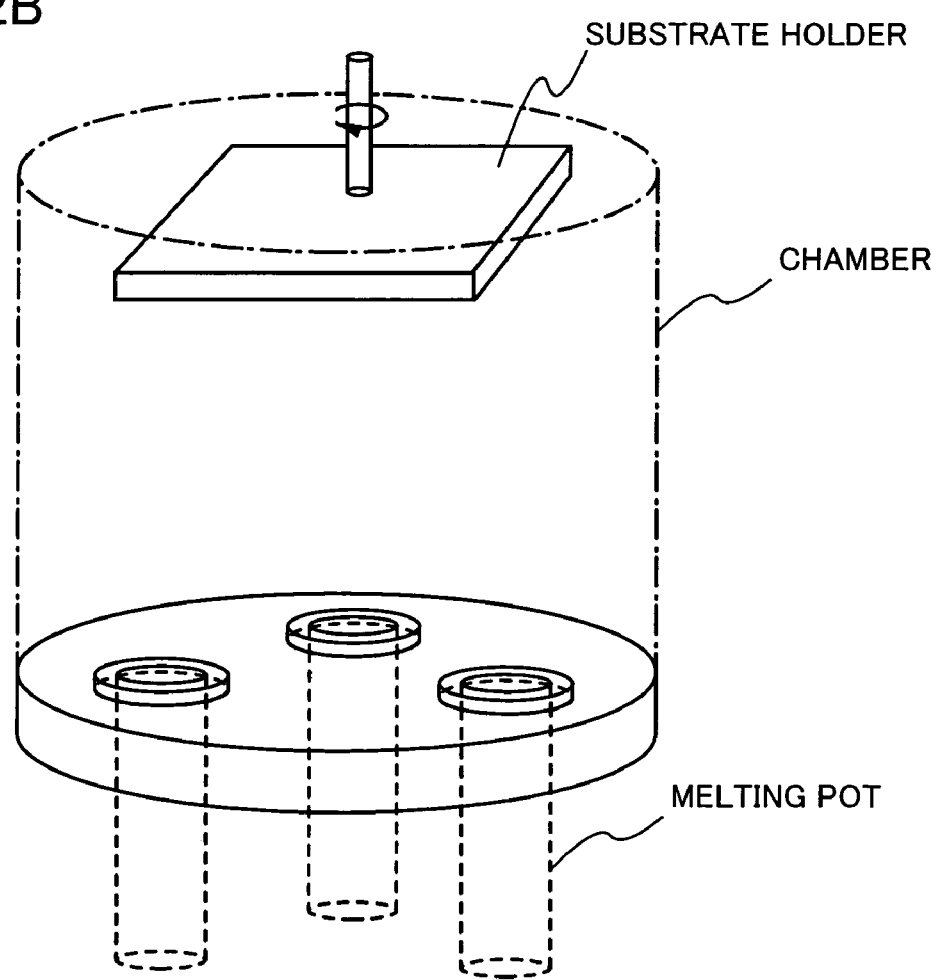

This embodiment gives with reference to FIG. 11 an example of a multi-chamber type manufacturing apparatus in which a manufacturing process from forming a first electrode to sealing is automated.

FIG. 11 shows a multi-chamber manufacturing apparatus which has gates 500a to 500y, transfer chambers 502, 504a, 508, 514, and 518, handing-over chambers 505, 507, and 511, a preparation chamber 501, a first film forming chamber 506H, a second film forming chamber 506B, a third film forming chamber 506G, a fourth film forming chamber 506R, a fifth film forming chamber 506E, other film forming chambers 509, 510, 512, 513, and 532, setting chambers 526R, 526G, 526B, 526E, and 526H in which evaporation sources are set, pretreatment chambers 503a and 503b, a sealing chamber 516, a mask stock chamber 524, a sealing substrate stock chamber 530, cassette chambers 520a and 520b, a tray putting stage 521, and a take-out chamber 519. The transfer chamber 504a is provided with a transfer mechanism 504b for transferring a substrate 504c. Similarly, other transfer chambers are provided with their own transfer mechanisms.

Shown below is a procedure of manufacturing a light emitting device after a substrate on which an anode (a first electrode) and an insulator (a partition wall) covering an end of the anode are already formed is brought into the manufacturing apparatus shown in FIG. 11. In the case where the device to be manufactured is an active matrix light emitting device, a thin film transistor connected to the anode (a current controlling TFT) is formed on the substrate in advance along with other thin film transistors (including a switching TFT) and a driving circuit that is composed of thin film transistors. The manufacturing apparatus shown in FIG. 11 can also be used to manufacture a passive matrix light emitting device.

First, the substrate is set in the cassette chamber 520a or the cassette chamber 520b. When the substrate is a large-sized substrate (for example, 300 mm×360 mm), the substrate is set in the cassette chamber 520b. When the substrate has normal size (for example, 127 mm×127 mm), the substrate is set in the cassette chamber 520a. The cassette is transferred to the tray putting stage 521 to set a plurality of substrates in a tray (e.g., 300 mm×360 mm).

A substrate (on which an anode and an insulator covering an end of the anode are formed) set in a cassette chamber is transferred to the transfer chamber 518.

Preferably, the substrate is cleaned before setting it in the cassette chamber by washing the surface of the first electrode (anode) with a porous sponge (typically made of PVA (polyvinyl alcohol) or nylon) dipped in an alkalescent surfactant to remove dusts on the surface and reduce point defect. The washing mechanism may be a washing device with a round PVA brush that comes into contact with the substrate face while rotating about the axis parallel to the substrate face. Alternatively, the washing mechanism may be a washing device with a PVA disc brush that comes into contact with the substrate face while rotating about the axis perpendicular to the substrate face. Before a film containing an organic compound is formed, the substrate is preferably subjected to annealing in vacuum for degasification. The annealing is conducted in a baking chamber 523 connected to the transfer chamber 518.

Next, the substrate is transferred from the transfer chamber 518 provided with the substrate transfer mechanism to the preparation chamber 501. In the manufacturing system of this embodiment, the robot provided in the transfer chamber 518 can turn the substrate upside down so that the inverted substrate is transferred to the preparation chamber 501. In this embodiment, the transfer chamber 518 is kept at the atmospheric pressure. The preparation chamber 501 is connected to a vacuum exhaust process chamber and, preferably, set to the atmospheric pressure by introducing inert gas into the chamber after the chamber is vacuum-exhausted.

The substrate is then transferred to the transfer chamber 502 that is connected to the preparation chamber 501. Preferably, the transfer chamber 502 is vacuum-exhausted in advance and remains vacuum, so that the chamber contains as little moisture and oxygen as possible.

The vacuum exhaust process chamber is provided with a magnetic levitation turbomolecular pump, a cryopump, or a dry pump. The pump makes it possible for the transfer chamber connected to the preparation chamber to reach a vacuum level of $10^{-5}$ to $10^{-6}$ Pa. Also, reverse diffusion of impurities from the pump side and the exhaust system can be prevented. In order not to let impurities enter the interior of the device, inert gas such as nitrogen or noble gas is introduced. The gas introduced into the device has to have high purity and is refined by a gas refining machine prior to introduction to the device interior. Accordingly, a gas refining machine is needed to give the gas high purity before it is introduced into the film forming device. In this way, oxygen, water, and other impurities are removed from the gas in advance and these impurities are prevented from entering the device.

If a film containing organic compound is formed in an area where the film is not necessary and if it is desired to remove the film, the substrate is transferred to the pretreatment chamber 503a to selectively remove the laminate of organic compound films. The pretreatment chamber 503a has plasma generating means, which generates plasma for dry etching by exciting one or more kinds of gas selected from the group consisting of Ar, H, F, and O. Selective removal of the film for removing unnecessary portions alone is made possible by the use of a mask. The pretreatment chamber 503a may have a UV irradiation mechanism for UV ray irradiation as anode surface treatment.

In order to avoid shrinkage, the substrate is preferably heated in vacuum immediately before forming a film containing an organic compound by evaporation. Accordingly, the substrate is transferred to the pretreatment chamber 503b and is subjected to annealing for degasification in vacuum ($5\times10^{-3}$ Torr (0.665 Pa) or lower, preferably, $10^{-4}$ to $10^{-6}$ Pa) to thoroughly remove moisture and gas from the substrate. The pretreatment chamber 503b uses flat heaters (typically sheathed heaters) to heat plural substrates uniformly. Since plural flat heaters are installed, a substrate may be sandwiched between flat heaters to heat both sides. Of course a substrate may be heated from one side alone. Vacuum heating is particularly effective when organic resins are used to form an interlayer insulating film and a partition wall because some organic resins readily absorb moisture and cause gas leakage. In this case, the moisture absorbed is removed by heating the substrate before forming a layer containing an organic compound at 100 to 250° C., preferably 150 to 200° C., for 30 minutes or longer and then the substrate is left to cool naturally for 30 minutes.

After the vacuum heating described above, the substrate is transferred from the transfer chamber 502 to the handing-over chamber 505, from which the substrate is transferred to the transfer chamber 504a without exposing it to the air.

The substrate is then transferred to the film forming chambers 506R, 506G, 506B, and 506E connected to the transfer chamber 504a to form as needed low-molecular weight organic compound layers that serve as hole injection layers, hole transporting layers, light emitting layers, electron transporting layers, and electron injection layers. The substrate may be transferred from the transfer chamber 502 to the film forming chamber 506H for evaporation.

In the film forming chamber 512, a hole injection layer may be formed from a high-molecular weight material by the ink jet method or spin coating under atmospheric pressure or reduced pressure. The substrate may be placed vertically to form a film by the ink jet method in vacuum. A film serving as a hole injection layer (an anode buffer layer) is formed on the first electrode (anode) by applying to the entire surface an aqueous solution of poly(ethylene dioxythiophene)/poly(styrene sulfonic acid) (referred to as PEDOT/PSS), an aqueous solution of polyaniline/camphor sulfonic acid (referred to as PANI/CSA), PTPDES, Et-PTPDEK, PPBA or the like and then baking the substrate. The baking is preferably carried out in the baking chamber 523. A hole injection layer formed from a high-molecular weight material by spin coating or other application method improves the levelness and therefore can give a film formed thereon excellent coverage and uniformity in thickness. In particular, the light emitting layer is given a uniform thickness to provide uniform light emission. In this case, it is preferable to put vacuum heating (at 100 to 200° C.) in immediately before the film is formed by evaporation after the hole injection layer is formed by application. The vacuum heating may be conducted in the pretreatment chamber 503b. For instance, the surface of the first electrode (anode) is washed with a sponge, the substrate is transferred to the cassette chamber and then to the film forming chamber, an aqueous solution of poly(ethylene dioxythiophene)/poly(styrene sulfonic acid) (referred to as PEDOT/PSS) is applied to the entire surface to form a film having a thickness of 60 nm, the substrate is transferred to the baking chamber 523 to pre-bake the film at 80° C. for 10 minutes and bake the film at 200° C. for an hour, the substrate is then transferred to the pretreatment chamber 503b and subjected to vacuum heating (heated at 170° C. for 30 minutes and cooled for 30 minutes) immediately before evaporation, and the substrate is transferred to the film forming chambers 506R, 506G, and 506B without exposing the substrate to the air to form light emitting layers by evaporation. If the anode is formed from an ITO film in particular and has concave and convex or minute particles on the surface, the influence of these can be reduced by setting the thickness of the PEDOT/PSS film to 30 nm or more.

PEDOT/PSS applied to an ITO film has poor wettability. Therefore the wettability of the film obtained through application of a PEDOT/PSS solution is improved by washing the film with pure water and then a PEDOT/PSS solution is applied for the second time by spin coating. The application is followed by baking and the obtained film has excellent uniformity. By washing with pure water after the first application, the surface quality is improved and at the same time an effect of removing minute particles is obtained.

The PEDOT/PSS film formed by spin coating covers the entire surface. Accordingly, it is preferable to selectively remove portions of the film that cover end faces and perimeter of the substrate, a terminal portion, a region where a cathode and a lower wire are connected to each other, and other connection regions. The selective removal is conducted by $O_2$ ashing or the like using a mask in the pretreatment chamber 503a.

Now, a description is given on the film forming chambers 506R, 506G, 506B, 506E, and 506H.

The film forming chambers 506R, 506G, 506B, 506E, and 506H each have movable evaporation source holders. Each of the evaporation source holders has a plurality of containers (melting pots) in which EL materials are sealed. In this state, the evaporation source holders are set in the film forming chambers. The substrate is set face down, an evaporation mask is aligned in position using a CCD or the like, and resistance heating is conducted to selectively form a film by evaporation. The evaporation mask is stocked in the mask stock chamber 524 and transferred to a film forming chamber upon evaporation as needed. Since the mask stock chamber is empty during evaporation, a substrate on which a film is already formed or a substrate that has finished processing may be stocked in the mask stock chamber. The film forming chamber 532 is a spare evaporation chamber for forming a layer containing an organic compound or a metal material layer.

Preferably, EL materials are set in these film forming chambers using the following manufacturing system. In this manufacturing system, a container (typically a melting pot) in which an EL material is stored in advance by a material maker is used to form a film. The melting pot is preferably shipped from the material maker while sealed in a second container and then is introduced to a film forming chamber in that state, so that the container is set without exposing it to the air. Desirably, the setting chambers 526R, 526G, 526B, 526H, and 526E having vacuum exhaust means are connected to the film forming chambers 506R, 506G, 506B, 506H, and 506E are exhausted of air or set to an inert gas atmosphere to take melting pots out of second containers and set the melting pot in the film forming chambers. Examples of the setting chambers are shown in FIGS. 9A and 9B and FIGS. 10A and 10B. In this way, a melting pot and an EL material stored in the melting pot can be protected from contamination. Metal masks may be stocked in the setting chambers 526R, 526G, 526B, 526H, and 526E.

Light emitting elements that emit light of single color (typically white) or light emitting elements that emit red, green, and blue light for a full color image are formed by accordingly choosing EL materials set in the film forming chambers 506R, 506G, 506B, 506H, and 506E. For instance, a light emitting element that emits green light is obtained by forming a hole transporting layer or a hole injection layer in the film forming chamber 506H, forming a light emitting layer (G) in the film forming chamber 506G, forming an electron transporting layer or an electron injection layer in the film formation chamber 506E, and then forming a cathode on this laminate. To obtain light emitting elements for a full color image, for instance, a hole transporting layer or a hole injection layer, a light emitting layer (R), and an electron transporting layer or an electron injection layer are layered in order in the film forming chamber 506R using an evaporation mask for R, then a hole transporting layer or a hole injection layer, a light emitting layer (G), and an electron transporting layer or an electron injection layer are layered in order in the film forming chamber 506G using an evaporation mask for G, then a hole transporting layer or a hole injection layer, a light emitting layer (B), and an electron transporting layer or an electron injection layer are layered in order in the film forming chamber 506R using an evaporation mask for B, and then a cathode is formed.

An organic compound layer, which emits white light and which is a laminate of light emitting layers having different light emission colors, is either a three wavelength type that includes primary color, i.e., red, green, and blue, or a two wavelength type that utilizes complementary color of blue and yellow or blue-green and orange. A white light emitting element may be formed in one film forming chamber. For instance, when a white light emitting element is obtained from a three wavelength type organic compound layer, plural film forming chambers having plural evaporation source holders in which plural melting pots are set are prepared. A first evaporation source holder has aromatic diamine (referred to as TPD) sealed therein. A second evaporation source holder has p-EtTAZ sealed therein. A third evaporation source holder has $Alq_3$ sealed therein. A fourth evaporation source holder has sealed therein an EL material obtained by doping $Alq_3$ with Nile Red that is a red light emitting pigment. A fifth evaporation source holder has $Alq_3$ sealed therein. The evaporation source holders with the evaporation materials sealed therein are set in the respective film forming chambers. The first to fifth evaporation source holders are moved in order to form films on the substrate through evaporation and layer the films. Specifically, TPD from the first evaporation source holder is sublimated by heating and is deposited by evaporation on the entire surface of the substrate. Thereafter, p-EtTAZ from the second evaporation source holder is sublimated, $Alq_3$ from the third evaporation source holder is sublimated, $Alq_3$: Nile Red from the fourth evaporation source holder is sublimated, and $Alq_3$ from the fifth evaporation source holder is sublimated to deposit the materials through evaporation on the entire surface of the substrate. Then a cathode is formed to complete a white light emitting element.

Through the above steps, layers containing organic compounds are suitably layered. After that, the substrate is transferred from the transfer chamber 504a to the handing-over chamber 507 and then to the transfer chamber 508 without exposing the substrate to the air.

Next, a transfer mechanism set in the transfer chamber 508 brings the substrate to the film forming chamber 510 to form a cathode. The cathode may be an inorganic film (MgAg, MgIn, $CaF_2$, LiF, CaN, or like other alloy film, or a film formed by co-evaporation of aluminum and an element that belongs to Group 1 or 2 in the periodic table, or a laminate of these films) formed by evaporation using resistance heating. Instead, sputtering may be used to form the cathode.

If an upward emission type light emitting device is to be manufactured, the cathode is preferably transparent or translucent and a thin (1 to 10 nm) film of one of the above metals or a laminate of a thin (1 to 10 nm) film of one of the above metals and a transparent conductive film is used as the cathode. In this case, a transparent conductive (ITO: indium tin oxide alloy) film, an indium oxide-zinc oxide alloy ($In_2O_3$—ZnO) film, a zinc oxide (ZnO) film, or the like is formed by sputtering in the film forming chamber 509.

A light emitting element having a laminate structure is completed through the above steps.

Before sealing, the substrate may be transferred to the film forming chamber 513 that is connected to the transfer chamber 508 to form a silicon nitride film or a silicon nitroxide film as a protective film. The film forming chamber 513 here has a silicon target, a silicon oxide target, or a silicon nitride target. For example, a silicon nitride film is formed on the cathode by using a silicon target and setting the atmosphere in the film forming chamber to a nitrogen atmosphere or an atmosphere containing nitrogen and argon. Alternatively, a thin film mainly containing carbon (a DLC film, a CN film, or an amorphous carbon film) may be formed as the protective film. A diamond-like carbon film (DLC film) can be formed by plasma CVD (typically RF plasma CVD, microwave CVD, electron cyclotron resonance (ECR) CVD, hot filament CVD, or the like), the flame method, sputtering, ion beam evaporation, laser evaporation, or the like. In forming the film, hydrogen gas and hydrocarbon-based gas (for example, $CH_4$, $C_2H_2$, or $C_6H_6$) are used as reaction gas and the elements are ionized by glow discharge to accelerate the ions and make them collide against the cathode to which a negative self-bias is applied. A CN film may be formed using as reaction gas $C_2H_4$ gas and $N_2$ gas. A DLC film and a CN film are insulating films transparent or translucent to visible light. "Transparent to visible light" means having a 80 to 100% transmittance to visible light whereas "translucent to visible light" means having a 50 to 80% transmittance to visible light.

In this embodiment, a laminate of a first inorganic insulating film, a stress-relieving film, and a second inorganic insulating film is formed as a protective film on the cathode. For instance, the first inorganic insulating film is formed by transferring the substrate to the film forming chamber 513 after the cathode is formed, then the substrate is transferred to the film forming chamber 532 to form the hygroscopic and transparent stress-relieving film (a layer containing an organic compound or the like) is formed by evaporation, and then the substrate is brought back to the film forming chamber 513 to form the second inorganic insulating film.

Next, the substrate on which the light emitting element is formed is transferred from the transfer chamber 508 to the handing-over chamber 511 without exposing the substrate to the air and then transferred from the handing-over chamber 511 to the transfer chamber 514. From the transfer chamber 514, the substrate on which the light emitting element is formed is transferred to the sealing chamber 516.

A sealing substrate is set from the outside and receives preparation in a sealing substrate loading chamber 517. Preferably, the sealing substrate is subjected to annealing in vacuum in advance to remove moisture and other impurities. If a sealing member for bonding the sealing substrate and the substrate on which the light emitting element is formed to each other is formed on the sealing substrate, the sealing member is formed on the sealing substrate in a sealing member forming chamber 555. Then, the sealing substrate is transferred to the sealing substrate stock chamber 530. The sealing substrate may be provided with a desiccant in the sealing member forming chamber 555. In the example shown here, the sealing member is formed on the sealing substrate. However, there is no particular limitation and the sealing member may be formed on the substrate that has the light emitting element formed thereon.

Then the substrate on which the light emitting element is formed and the sealing substrate on which the sealing member is formed are bonded to each other in the sealing chamber 516. The sealing member is cured by using a UV ray irradiation mechanism that is provided in the sealing chamber 516 to irradiate the pair of bonded substrates with UV light. Although the sealing member here is a UV-curable resin, there is no particular limitation and any adhesive can be used as the sealing member.

The pair of bonded substrates is transferred from the sealing chamber 516 to the transfer chamber 514, and to the take-out chamber 519, where the pair of substrates is taken out of the device.

As described, the use of the manufacturing apparatus shown in FIG. 11 makes it possible to avoid exposure of a light emitting element to the air before the light emitting element is completely sealed in an airtight space. Therefore a light emitting device of high reliability can be manufactured. In the transfer chamber 514, the substrate is transferred at the atmospheric pressure and vacuum is alternated with a nitrogen atmosphere at the atmospheric pressure repeatedly to remove moisture. On the other hand, the transfer chambers 502, 504a, and 508 are desirably vacuum all the time. The transfer chamber 518 is kept at the atmospheric pressure.

Although not shown in the drawing, the manufacturing apparatus has a control device for controlling workings of film forming chambers, a control device for transferring a substrate between process chambers, and a control device for controlling paths to move a substrate to process chambers for automation.

The manufacturing apparatus shown in FIG. 11 is also capable of forming an upward emission type (or the type that emits light from both sides) light emitting element. In this case, a substrate with an anode formed from a transparent conductive film (or a metal (TiN) film) is brought in the manufacturing apparatus, a layer containing an organic compound is formed, and then a transparent or translucent cathode (e.g., a laminate of a thin metal (Al or Ag) film and a transparent conductive film) is formed. The term upward emission type light emitting element refers to an element in which light generated in an organic compound layer is transmitted through a cathode before it is emitted outside.

The manufacturing apparatus shown in FIG. 11 is also capable of forming a downward emission type light emitting element. In this case, a substrate with an anode formed from a transparent conductive film is brought in the manufacturing apparatus, a layer containing an organic compound is formed, and then a cathode is formed from a metal (Al or Ag) film. The term downward emission type light emitting element refers to an element in which light generated in an organic compound layer travels toward a TFT from the anode that is a transparent electrode and is transmitted through the substrate.

Also, this embodiment can be combined freely with Embodiment Modes 1 through 5 or Embodiment 1, 2, or 4.

The system of the present invention does not need glass jars, which usually end up as industrial waste, and therefore is environmentally friendly. In addition, since a material maker stores, or refines and stores, an EL material directly in a container, a light emitting device maker does not have to buy an EL material in excess and can use a relatively expensive EL material efficiently.

The present invention eliminates the need to move an EL material from a glass jar to a container. Accordingly, a light emitting device maker is relieved of the work of transferring an EL material between containers and the maker only has to perform a simple operation to set in an evaporation apparatus a container in which an EL material is stored, or refined and stored, by a material maker in advance. As a result, the throughput is improved.

The present invention can further realize a manufacturing system in which the process is thoroughly automated to improve the throughput, as well as an integrated closed system capable of avoiding impurity contamination.

No matter how pure EL material a material maker provides, there is always a possibility of impurity contamination as long as a light emitting device maker moves the EL material between containers as in prior art. Accordingly, the purity of an EL material cannot be maintained and a limitation is imposed on the purity. According to the present invention, an extremely high purity can be maintained for an EL material which is provided by the material maker and the material is subjected to evaporation at the light emitting device maker without reducing its purity as it is. That is, the present invention makes it possible to readily cope with future ultrapure EL materials.

What is claimed is:

1. A manufacturing process comprising:
   refining an evaporation material at a material maker;
   storing the evaporation material in a first container;
   sealing the first container that stores the evaporation material in a second container at the material maker;
   transferring the second container to a light emitting device maker;
   introducing the second container into a manufacturing apparatus at the light emitting device maker and taking the first container out of the second container; and
   heating the first container to evaporate the evaporation material in the manufacturing apparatus.

2. A process according to claim 1, wherein the first container is stored in the second container in one of an inert gas atmosphere and a vacuum and, after the evaporation material is stored, the second container is placed in the manufacturing apparatus without exposing the first container to air.

3. A process according to claim 1, wherein the manufacturing apparatus has plural process chambers equipped with an exhaust pump, a process chamber where the first container is taken out of the second container, and a vacuum evaporation apparatus.

4. A process according to claim 1, wherein the first container is a melting pot.

5. A process according to claim 1, wherein the first container is a melting pot that can be sealed with a lid attached thereto.

6. A process according to claim 1, wherein the second container is a light-shielding container.

7. A process according to claim 1, wherein the second container is a container that can withstand depressurization and pressurization.

8. A process according to claim 1, wherein the material maker cleans at least one of the first container and the second container.

9. A process according to claim 1, wherein the material maker recovers the evaporation material adhered to the inner walls of the first container after evaporation for recycling.

10. A process according to claim 1, wherein the manufacturing apparatus is a vacuum evaporation apparatus.

11. A process according to claim 1, wherein the manufacturing apparatus is a multi chamber having at least one vacuum evaporation apparatus.

12. A process according to claim 1, wherein the evaporation material is a light emitting material.

13. A manufacturing process according to claim 1, wherein the evaporation material is an organic compound or a metal material.

14. A manufacturing process comprising:
    transferring a first container and a second container from an apparatus maker to a material maker;
    refining an evaporation material at the material maker;
    storing the evaporation material in the first container;
    sealing the first container that stores the evaporation material in the second container at the material maker;
    transferring the second container to a light emitting device maker;
    introducing the second container into a manufacturing apparatus at the light emitting device maker and taking the first container out of the second container; and
    heating the first container to evaporate the evaporation material in the manufacturing apparatus.

15. A process according to claim 14, wherein the first container is stored in the second container in one of an inert gas atmosphere and a vacuum and, after an evaporation material is stored, the second container is placed in the manufacturing apparatus without exposing the first container to air.

16. A process according to claim 14, wherein the manufacturing apparatus has plural process chambers equipped with an exhaust pump, a process chamber where the first container is taken out of the second container, and a vacuum evaporation apparatus.

17. A process according to claim 14, wherein the first container is a melting pot.

18. A process according to claim 14, wherein the first container is a melting pot that can be sealed with a lid attached thereto.

19. A process according to claim 14, wherein the second container is a light-shielding container.

20. A process according to claim 14, wherein the second container is a container that can withstand depressurization and pressurization.

21. A process according to claim 14, wherein the material maker cleans at least one of the first container and the second container.

22. A process according to claim 14, wherein the material maker recovers the evaporation material adhered to the inner walls of the first container after evaporation for recycling.

23. A process according to claim 14, wherein the manufacturing apparatus is a vacuum evaporation apparatus.

24. A process according to claim 14, wherein the manufacturing apparatus is a multi chamber having at least one vacuum evaporation apparatus.

25. A process according to claim 14, wherein the evaporation material is a light emitting material.

26. A manufacturing process according to claim 14, wherein the evaporation material is an organic compound or a metal material.

27. A manufacturing process comprising:
transferring a second container and a first container from a light emitting device maker to a material maker;
refining an evaporation material at the material maker;
storing the evaporation material in the first container;
sealing the first container that stores the evaporation material in the second container at the material maker;
transferring the second container to the light emitting device maker;
introducing the second container into a manufacturing apparatus at the light emitting device maker and taking the first container out of the second container; and
heating the first container to evaporate the evaporation material in the manufacturing apparatus.

28. A process according to claim 27, wherein the first container is stored in the second container in one of an inert gas atmosphere and a vacuum and, after an evaporation material is stored, the second container is placed in the manufacturing apparatus without exposing the first container to air.

29. A process according to claim 27, wherein the manufacturing apparatus has plural process chambers equipped with an exhaust pump, a process chamber where the first container is taken out of the second container, and a vacuum evaporation apparatus.

30. A process according to claim 27, wherein the first container is a melting pot.

31. A process according to claim 27, wherein the first container is a melting pot that can be sealed with a lid attached thereto.

32. A process according to claim 27, wherein the second container is a light-shielding container.

33. A process according to claim 27, wherein the second container is a container that can withstand depressurization and pressurization.

34. A process according to claim 27, wherein the material maker cleans at least one of the first container and the second container.

35. A process according to claim 27, wherein the material maker recovers the evaporation material adhered to the inner walls of the first container after evaporation for recycling.

36. A process according to claim 27, wherein the manufacturing apparatus is a vacuum evaporation apparatus.

37. A process according to claim 27, wherein the manufacturing apparatus is a multi chamber having at least one vacuum evaporation apparatus.

38. A process according to claim 27, wherein the evaporation material is a light emitting material.

39. A manufacturing process according to claim 27, wherein the evaporation material is an organic compound or a metal material.

40. A manufacturing process comprising:
transferring a first container and a second container from a light emitting device maker to a material maker;
refining an evaporation material at the material maker;
storing the evaporation material in the first container;
sealing the first container that stores the evaporation material in the second container at the material maker;
transferring the second container to the light emitting device maker;
introducing the second container into a manufacturing apparatus at the light emitting device maker and taking the first container out of the second container;
heating the first container to evaporate the evaporation material in the manufacturing apparatus; and
taking the first container out of the manufacturing apparatus and sealing the first container in the second container to transfer the second container having the first container from the light emitting device maker to the material maker.

41. A process according to claim 40, wherein the first container is stored in the second container in one of an inert gas atmosphere and a vacuum and, after an evaporation material is stored, the second container is placed in the manufacturing apparatus without exposing the first container to air.

42. A process according to claim 40, wherein the manufacturing apparatus has plural process chambers equipped with an exhaust pump, a process chamber where the first container is taken out of the second container, and a vacuum evaporation apparatus.

43. A process according to claim 40, wherein the first container is a melting pot.

44. A process according to claim 40, wherein the first container is a melting pot that can be sealed with a lid attached thereto.

45. A process according to claim 40, wherein the second container is a light-shielding container.

46. A process according to claim 40, wherein the second container is a container that can withstand depressurization and pressurization.

47. A process according to claim 40, wherein the material maker cleans at least one of the first container and the second container.

48. A process according to claim 40, wherein the material maker recovers the evaporation material adhered to the inner walls of the first container after evaporation for recycling.

49. A process according to claim 40, wherein the manufacturing apparatus is a vacuum evaporation apparatus.

50. A process according to claim 40, wherein the manufacturing apparatus is a multi chamber having at least one vacuum evaporation apparatus.

51. A process according to claim 40, wherein the evaporation material is a light emitting material.

52. A manufacturing process according to claim 40, wherein the evaporation material is an organic compound or a metal material.

53. A manufacturing process comprising:
refining an evaporation material;
storing the evaporation material in a first container and sealing the first container that stores the evaporation material in a second container;
transferring the second container to a manufacturing apparatus;
introducing the second container into the manufacturing apparatus and taking the first container out of the second container; and
heating the first container to evaporate the evaporation material in the manufacturing apparatus without being exposed to air.

54. A process according to claim 53, wherein the first container is stored in the second container in one of an inert gas atmosphere and vacuum and, after the evaporation material is stored, the first container is placed in the manufacturing apparatus without exposing the first container to air.

55. A process according to claim 53, wherein the manufacturing apparatus has plural process chambers equipped with an exhaust pump, a process chamber where the first container is taken out of the second container, and a vacuum evaporation apparatus.

56. A process according to claim 53, wherein the first container is a melting pot.

57. A process according to claim 53, wherein the first container is a melting pot that can be sealed with a lid attached thereto.

58. A process according to claim 53, wherein the second container is a light-shielding container.

59. A process according to claim 53, wherein the second container is a container that can withstand depressurization and pressurization.

60. A process according to claim 53, wherein at least one of the first container and the second container is cleaned for recycling.

61. A process according to claim 53, wherein the evaporation material adhered to the inner walls of the first container is recovered after evaporation for recycling.

62. A process according to claim 53, wherein the manufacturing apparatus is a vacuum evaporation apparatus.

63. A process according to claim 53, wherein the manufacturing apparatus is a multi chamber having at least one vacuum evaporation apparatus.

64. A process according to claim 53, wherein the evaporation material is a light emitting material.

65. A manufacturing process according to claim 53, wherein the evaporation material is an organic compound or a metal material.

66. A manufacturing process comprising:
refining an evaporation material;
storing the evaporation material in a first container and sealing the first container that stores the evaporation material in a second container;
transferring the second container to a manufacturing apparatus;
introducing the second container into the manufacturing apparatus and taking the first container out of the second container; and
heating the first container to evaporate the evaporation material by resistance heating in the manufacturing apparatus without being exposed to air.

67. A manufacturing process according to claim 66, wherein the evaporation material is refined by sublimation on an inner wall of the first container.

68. A manufacturing process according to claim 66, wherein the evaporation material is a conductive material that serves as a cathode or as an anode of a light-emitting element.

69. A manufacturing process according to claim 66, wherein the first container is stored in the second container in one of an inert gas atmosphere and a vacuum and, after the evaporation material is stored, the second container is placed in the manufacturing apparatus without exposing the first container to air.

70. A manufacturing process according to claim 66, wherein the manufacturing apparatus has plural process chambers equipped with an exhaust pump, a process chamber where the first container is taken out of the second container, and a vacuum evaporation apparatus.

71. A manufacturing process according to claim 66, wherein the first container is a melting pot.

72. A manufacturing process according to claim 66, wherein the first container is a melting pot that can be sealed with a lid attached thereto.

73. A manufacturing process according to claim 66, wherein the second container is a light-shielding container.

74. A manufacturing process according to claim 66, wherein the second container is a container that can withstand depressurization and pressurization.

75. A manufacturing process according to claim 66, wherein a material maker cleans at least one of the first container and the second container.

76. A manufacturing process according to claim 66, wherein a material maker recovers the evaporation material adhered to the inner walls of the first container after evaporation for recycling.

77. A manufacturing process according to claim 66, wherein the manufacturing apparatus is a vacuum evaporation apparatus.

78. A manufacturing process according to claim 66, wherein the manufacturing apparatus is a multi chamber having at least one vacuum evaporation apparatus.

79. A manufacturing process according to claim 66, wherein the evaporation material is an organic compound or a metal material.

80. A manufacturing process comprising:
refining an evaporation material;
storing the evaporation material in a first container and sealing the first container that stores the evaporation material in a second container;
transferring the second container to a manufacturing apparatus;
introducing the second container into the manufacturing apparatus and taking the first container out of the second container; and
heating the first container to evaporate the evaporation material by an evaporation method using an electron gun in the manufacturing apparatus without being exposed to air.

81. A manufacturing process according to claim 80, wherein the evaporation material is refined by sublimation on an inner wall of the first container.

82. A manufacturing process according to claim 80, wherein the evaporation material is a conductive material that serves as a cathode or as an anode of a light-emitting element.

83. A manufacturing process according to claim 80, wherein the first container is stored in the second container in one of an inert gas atmosphere and a vacuum and, after the evaporation material is stored, the second container is placed in the manufacturing apparatus without exposing the first container to air.

84. A manufacturing process according to claim 80, wherein the manufacturing apparatus has plural process chambers equipped with an exhaust pump, a process chamber where the first container is taken out of the second container, and a vacuum evaporation apparatus.

85. A manufacturing process according to claim 80, wherein the first container is a melting pot.

86. A manufacturing process according to claim 80, wherein the first container is a melting pot that can be sealed with a lid attached thereto.

87. A manufacturing process according to claim 80, wherein the second container is a light-shielding container.

88. A manufacturing process according to claim 80, wherein the second container is a container that can withstand depressurization and pressurization.

89. A manufacturing process according to claim 80, wherein a material maker cleans at least one of the first container and the second container.

90. A manufacturing process according to claim 80, wherein a material maker recovers the evaporation material adhered to the inner walls of the first container after evaporation for recycling.

91. A manufacturing process according to claim 80, wherein the manufacturing apparatus is a vacuum evaporation apparatus.

92. A manufacturing process according to claim 80, wherein the manufacturing apparatus is a multi chamber having at least one vacuum evaporation apparatus.

93. A manufacturing process according to claim 80, wherein the evaporation material is an organic compound or a metal material.

* * * * *